United States Patent
Kobayashi

(10) Patent No.: US 9,391,102 B2
(45) Date of Patent: Jul. 12, 2016

(54) IMAGING DEVICE

(71) Applicant: CANON KABUSHIKI KAISHA, Tokyo (JP)

(72) Inventor: Masahiro Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/805,254

(22) Filed: Jul. 21, 2015

(65) Prior Publication Data

US 2016/0027824 A1 Jan. 28, 2016

(30) Foreign Application Priority Data

Jul. 24, 2014 (JP) ................... 2014-151122

(51) Int. Cl.
H01L 31/062 (2012.01)
H01L 27/146 (2006.01)
H01L 29/36 (2006.01)
H01L 29/94 (2006.01)

(52) U.S. Cl.
CPC .... H01L 27/14605 (2013.01); H01L 27/14603 (2013.01); H01L 27/14609 (2013.01); H01L 27/14612 (2013.01); H01L 27/14614 (2013.01); H01L 27/14621 (2013.01); H01L 27/14636 (2013.01); H01L 27/14645 (2013.01); H01L 27/14689 (2013.01); H01L 29/36 (2013.01); H01L 29/94 (2013.01)

(58) Field of Classification Search
CPC ................................ H01L 27/14612
USPC ........................................ 257/292
See application file for complete search history.

(56) References Cited

U.S. PATENT DOCUMENTS

2011/0234830 A1* 9/2011 Kiyota ............. H01L 27/14609
348/222.1
2013/0214124 A1* 8/2013 Mueller ................... G01V 8/20
250/206.1

FOREIGN PATENT DOCUMENTS

JP 2008-205639 A 9/2008

* cited by examiner

Primary Examiner — Tuan Nguyen
(74) Attorney, Agent, or Firm — Canon USA, Inc. IP Division

(57) ABSTRACT

An imaging device includes pixels each of which includes a photoelectric converter including a p-n junction formed of a first semiconductor region and a second semiconductor region, an amplifying transistor configured to amplify a signal based on signal carriers, and a capacitance including a p-n junction formed of a third semiconductor region having the same conductivity type as the first semiconductor region and a fourth semiconductor region having the opposite conductivity type to the third semiconductor region. A doping impurity concentration of an impurity of the same conductivity type as the conductivity type of the third semiconductor region at the p-n junction interface of the capacitance is higher than a doping impurity concentration of an impurity of the same conductivity type as the conductivity type of the first semiconductor region at the p-n junction interface of the photoelectric converter.

19 Claims, 14 Drawing Sheets

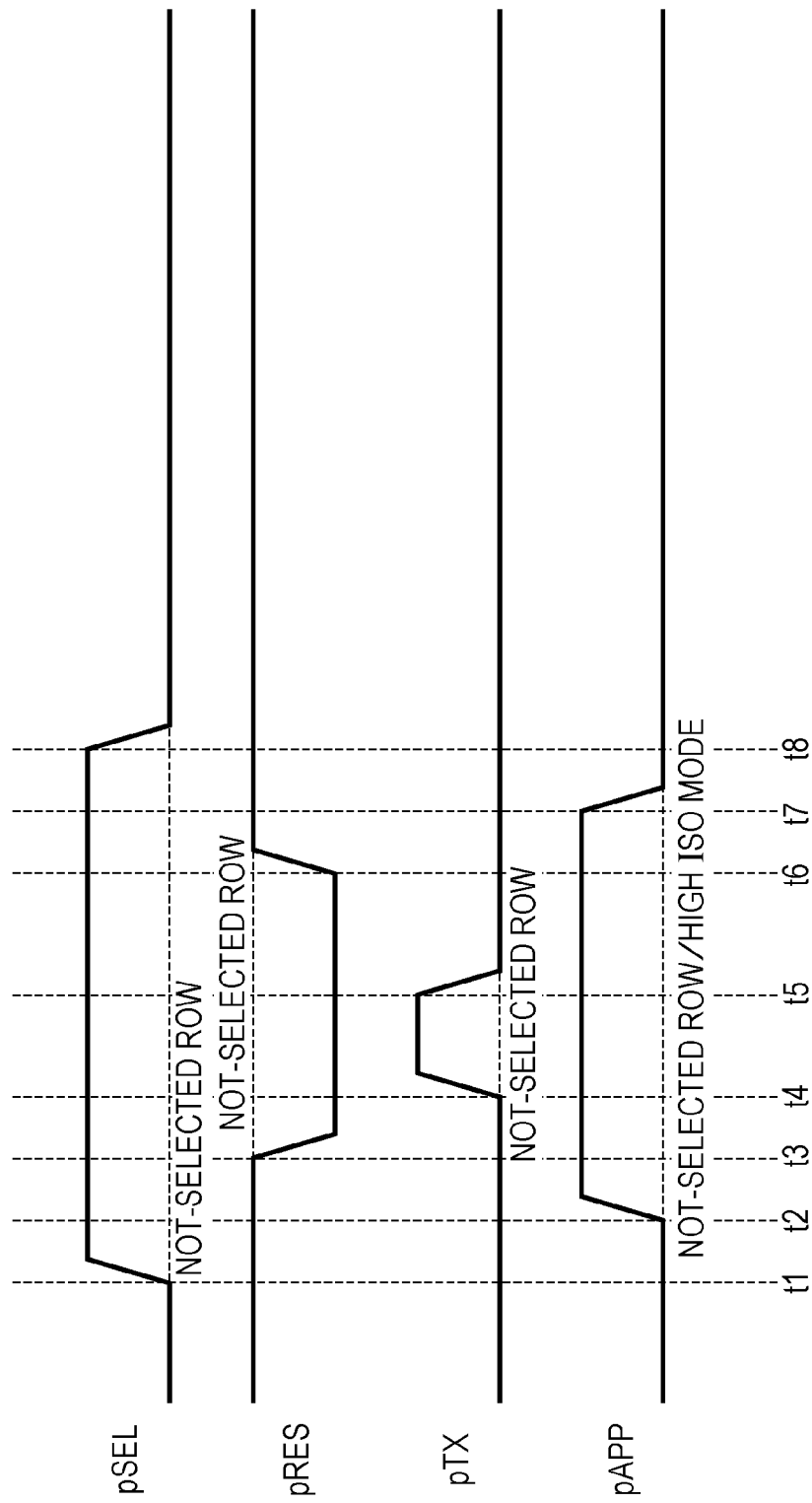

IMAGING DEVICE

BACKGROUND OF THE INVENTION

1. Field of the Invention

The present invention relates generally to imaging devices and, more particularly, to a structure of a capacitance that makes a capacitance value of an input node of an amplifying transistor of a pixel variable.

2. Description of the Related Art

In the related art, there is known a configuration in which a capacitance is connected to a floating diffusion (FD) in order to increase the dynamic range of a signal output from a pixel.

Japanese Patent Laid-Open No. 2008-205639 describes a configuration using a p-n junction, as a configuration of a capacitance connected to the FD.

SUMMARY OF THE INVENTION

An aspect of the present invention provides an imaging device including a plurality of pixels. Each of the plurality of pixels includes a photoelectric converter including a p-n junction formed of a first semiconductor region and a second semiconductor region and for accumulating signal carriers in the second semiconductor region, an amplifying transistor configured to amplify a signal based on the signal carriers, and a capacitance including a p-n junction formed of a third semiconductor region and a fourth semiconductor region, the third semiconductor region having a conductivity type identical to a conductivity type of the first semiconductor region, the fourth semiconductor region having a conductivity type opposite to the conductivity type of the third semiconductor region. Each of the plurality of pixels changes a capacitance value of an input node of the amplifying transistor by switching a connection state of the capacitance. A doping impurity concentration of an impurity of a conductivity type identical to the conductivity type of the third semiconductor region at an interface of the p-n junction of the capacitance is higher than a doping impurity concentration of an impurity of a conductivity type identical to the conductivity type of the first semiconductor region at an interface of the p-n junction of the photoelectric converter. The amplifying transistor has a gate disposed on a principal surface of a semiconductor substrate. The first semiconductor region is disposed at a position deeper than a position of the second semiconductor region with respect to the principal surface. The third semiconductor region is disposed at a position deeper than a position of the fourth semiconductor region with respect to the principal surface.

Further features of the present invention will become apparent from the following description of exemplary embodiments with reference to the attached drawings.

BRIEF DESCRIPTION OF THE DRAWINGS

FIG. 3 is a timing chart illustrating driving timings.

DESCRIPTION OF THE EMBODIMENTS

Figure 1:
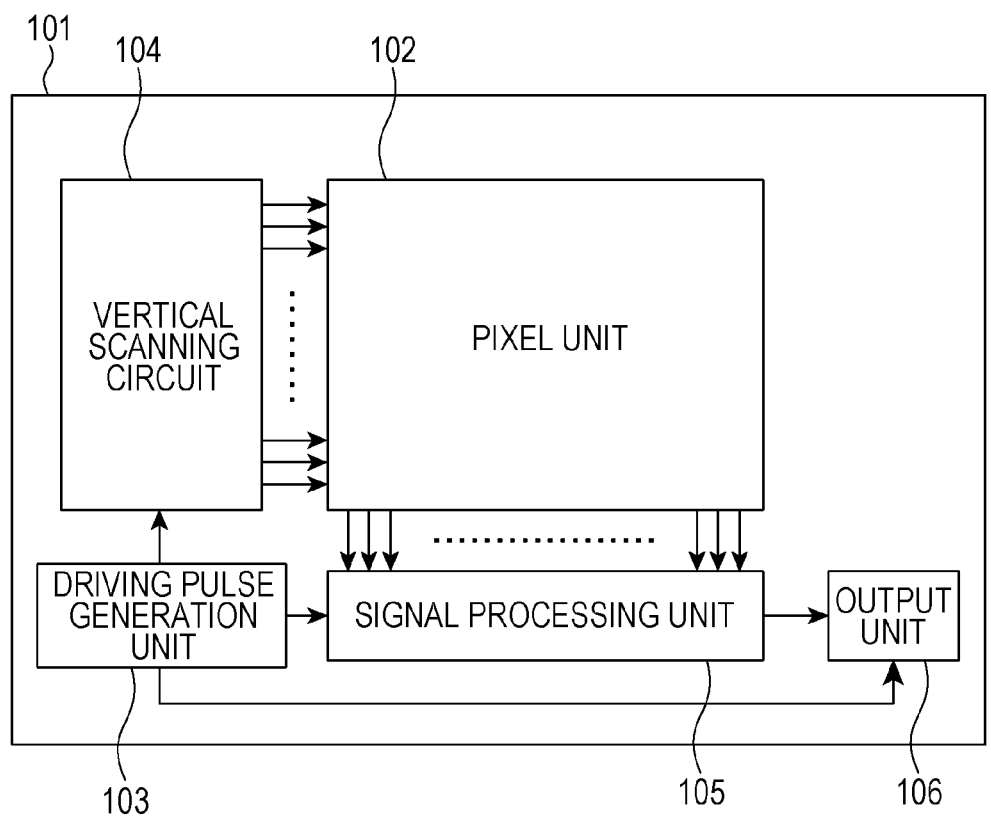
FIG. 1 is a block diagram of an imaging device.

Referring to FIGS. 1 to 6C, an imaging device according to an embodiment of the present invention will be described. Note that components denoted by the same reference numerals throughout the drawings indicate the same or substantially the same elements or regions.

FIG. 1 is a block diagram of an imaging device according to an embodiment of the present invention. An imaging device 101 includes a pixel unit 102, a driving pulse generation unit 103, a vertical scanning circuit 104, a signal processing unit 105, and an output unit 106.

The pixel unit 102 includes a plurality of pixels arranged in a matrix form. Each of the plurality of pixels converts light into an electric signal and outputs the resulting electric signal. The driving pulse generation unit 103 generates a driving pulse. The vertical scanning circuit 104 receives the driving pulse from the driving pulse generation unit 103 and supplies each pixel with control pulses. The signal processing unit 105 at least serializes signals output from a plurality of pixel columns in parallel and transfers the resulting signal to the output unit 106. The signal processing unit 105 may further include column circuits which correspond to the respective pixel columns. Each of the column circuits performs processing such as signal amplification and analog-to-digital (A/D) conversion.

Figure 2:
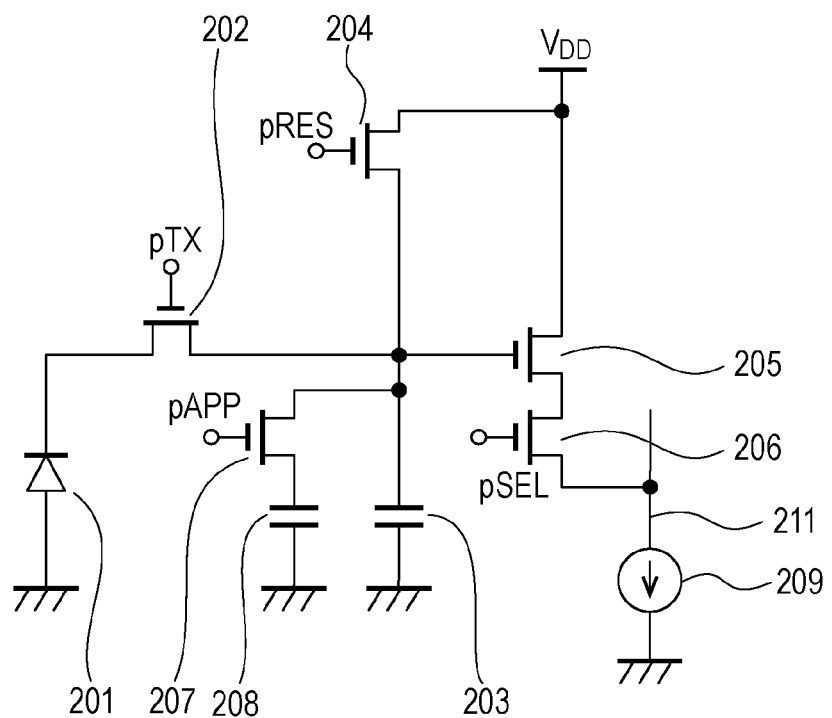
FIG. 2 is a circuit diagram of a pixel.

FIG. 2 illustrates an example of an equivalent circuit of each of the pixels arranged in the pixel unit 102 according to the embodiment. In the embodiment, a description will be given of the case where electrons are used as signal carriers and transistors are n-type transistors. Note that the conductivity type is not limited to this particular type, and holes may be used as signal carriers and p-type transistors may be used as the transistors of each pixel.

In addition, the configuration of the pixel is not limited to the equivalent circuit of FIG. 2, and one or more components may be shared among a plurality of pixels. This embodiment is applicable to both front-illuminated imaging devices on which light is incident from the front side of the imaging devices and back-illuminated imaging devices on which light is incident from the back side of the imaging devices. This also applies to exemplary embodiments described below.

Each pixel according to the embodiment includes a capacitance 208 which makes a capacitance value of an input node of an amplifying transistor 205 variable. The input node of the amplifying transistor 205 is constituted by a floating diffusion (FD) 203, a source of a reset transistor 204, a gate of the amplifying transistor 205, and a conductor that electrically connects the FD 203, the source of the reset transistor 204, and the gate of the amplifying transistor 205 to one another.

The capacitance 208 is disposed such that the capacitance 208 can be connected to and disconnected from any of these members.

Accordingly, the capacitance 208, in a connected state, serves as a part of the input node of the amplifying transistor 205. The pixel according to the embodiment will be described in detail below with reference to FIG. 2.

A photoelectric converter 201 generates carrier pairs corresponding to the amount of incident light by photoelectric conversion and accumulates electrons. A transfer transistor 202 transfers the electrons accumulated in the photoelectric converter 201 to the FD 203. A control pulse pTX is supplied to a gate of the transfer transistor 202 and switches between an ON-state and an OFF-state of the transfer transistor 202. The FD 203 holds the electrons transferred by the transfer transistor 202.

The FD 203 is connected to the gate of the amplifying transistor 205. The amplifying transistor 205 amplifies a signal based on the electrons transferred to the FD 203 by the transfer transistor 202 and outputs the resulting signal. More specifically, the transferred electrons in the FD 203 are converted into a voltage according to the amount, and an electric signal based on the voltage is output to outside the pixel via the amplifying transistor 205. The amplifying transistor 205 and a current source 209 form a source-follower circuit.

The reset transistor 204 resets the potential of the input node of the amplifying transistor 205. In addition, the potential of the photoelectric converter 201 can be reset by causing ON-periods of the reset transistor 204 and the transfer transistor 202 to coincide with each other. A control pulse pRES is supplied to a gate of the reset transistor 204 and switches between the ON-state and the OFF-state of the reset transistor 204.

A selection transistor 206 outputs a signal of a plurality of pixels provided for each signal line 211 one signal or multiple signals at a time. A drain of the selection transistor 206 is connected to a source of the amplifying transistor 205. A source of the selection transistor 206 is connected to the corresponding signal line 211.

In place of the configuration of this embodiment, the selection transistor 206 may be connected between a drain of the amplifying transistor 205 and a power-supply line supplied with a power-supply voltage. In either case, the selection transistor 206 controls the electrical conduction between the amplifying transistor 205 and the signal line 211. A control pulse pSEL is supplied to a gate of the selection transistor 206 and switches between the ON-state and the OFF-state of the selection transistor 206.

Note that the selection transistor 206 may be omitted. In this case, the source of the amplifying transistor 205 is connected to the signal line 211, and a selected state and a not-selected state may be switched between by switching the potential of the drain or gate of the amplifying transistor 205.

The capacitance 208, in the connected state, serves as a part of the input node of the amplifying transistor 205 and, in a disconnected state, is separated from the input node. Such a configuration makes the capacitance value of the input node of the amplifying transistor 205 variable. In this embodiment, a switching transistor 207 controls switching between the connected state and the disconnected state of the capacitance 208.

The capacitance 208 and the switching transistor 207 share some of their elements. For example, the capacitance 208 can be formed of capacitance of a gate insulating film of the switching transistor 207, capacitance of a p-n junction formed of an n-type semiconductor region which serves as the source of the switching transistor 207, and stray capacitance; however, the capacitance 208 and the switching transistor 207 may be formed of independent elements instead of sharing elements.

A control pulse pAPP is supplied to a gate of the switching transistor 207 and switches between the ON-state and the OFF-state of the switching transistor 207.

In the case where the capacitance 208 is set in the connected state and the capacitance value of the input node of the amplifying transistor 205 is increased, the charge-voltage conversion efficiency at the input node of the amplifying transistor 205 can be made lower than in the case where the capacitance 208 is in the disconnected state.

That is, if the amount of signal carriers transferred to the input node of the amplifying transistor 205 is constant, the amplitude of a voltage obtained by conversion of the signal carriers becomes smaller at the input node of the amplifying transistor 205 than in the case where the capacitance value of the amplifying transistor 205 is not increased. As a result, the FD 203 is less likely to be saturated even if a high-luminance signal is input.

In contrast, in the case where the capacitance 208 is set in the disconnected state to make the capacitance value of the input node of the amplifying transistor 205 small, the charge-voltage conversion efficiency at the input node of the amplifying transistor 205 improves compared with the case where the capacitance 208 is in the connected state.

That is, if the amount of transferred signal carriers is constant, the amplitude of a voltage obtained by conversion of the signal carriers becomes larger at the input node of the amplifying transistor 205. Thus, a signal-to-noise (S/N) ratio improves at the constant noise level. The use of the above-described configurations in a switching manner makes the dynamic range variable.

FIG. 3 illustrates an example of control pulses used in the pixel circuit illustrated in FIG. 2. Only control pulses directly relating to features of this embodiment will be described here.

Referring to FIG. 3, a solid line indicates control pulses for pixels in which the capacitance 208 is set in the connected state or in a mode in which the capacitance 208 is set in the connected state.

In addition, a dashed line indicates control pulses for pixels in which the capacitance 208 is set in the disconnected state, pixels in the not-selected state, or in a mode in which the capacitance 208 is in the disconnected state. While each control pulse is at a high level, a corresponding transistor is in the ON-state.

At time t1, the control pulse pSEL changes to the high level. At this time, the control pulse pRES is at the high level. Thus, the FD 203 has a reference potential.

At time t2, the control pulse pAPP changes to the high level while the control pulses pSEL and pRES are kept at the high level. As a result, the capacitance 208 is connected to the FD 203, and the FD 203 and the capacitance 208 have the reference potential.

At time t3, the control pulse pRES changes to a low level, and resetting of the potentials of the FD 203 and the capacitance 208 completes.

At time t4, the control pulse pTX changes to the high level. At this time, the photoelectric converter 201 and the FD 203 become electrically conductive, and electrons in the photoelectric converter 201 are transferred to the FD 203. At this time, the control pulse pAPP is at the high level, and the capacitance 208 is in the connected state. Thus, the transferred electrons are held in the FD 203 and the capacitance 208.

At time t5, the control pulse pTX changes to the low level. As a result, conduction between the photoelectric converter 201 and the FD 203 is broken.

At time t6, the control pulse pRES changes to the high level. As a result, the potentials of the FD 203 and the capacitances 208 are reset.

At time t7, the control pulse pAPP changes to the low level. As a result, the capacitance 208 is set in the disconnected state.

At time t8, the control pulse pSEL changes the low level.

By using a voltage at the signal line 211 as a signal in a period from time t5 to time t8, a signal of the pixel in which the capacitance 208 is in the connected state can be used as an image signal.

Further, by using a voltage at the signal line 211 in a period from time t3 to time t4 as a signal if necessary, a noise signal of the pixel can be obtained. Noise can be reduced by subtracting this noise signal from the aforementioned image signal. The control pulse pSEL is kept at the high level for a period from time t1 to time t8; however, the control pulse pSEL may be kept at the high level for a period over which the signal held at the input node of the amplifying transistor 205 and the capacitance 208 is read to the signal processing unit 105 illustrated in FIG. 1.

FIG. 3 illustrates control pulses that set the capacitance 208 in the connected state. The capacitance 208 is kept in the disconnected state by making the control pulse pAPP have the low level for a period from time t2 to time t7.

By switching between the connected state and the disconnected state of the capacitance 208 in this manner, the capacitance value of the input node of the amplifying transistor 205 can be switched. The connected state and the disconnected state of the capacitance 208 may be switched between collectively for all the pixels or on a pixel-by-pixel basis. In the case of performing switching on a pixel-by-pixel basis, the connected state and the disconnected state of the capacitance 208 may be switched between on a color-filter color basis.

Now, features of the capacitance 208 according to the embodiment will be described.

The capacitance 208 according to the embodiment includes a p-n junction capacitance. A doping p-type impurity concentration of a p-type semiconductor region at the p-n junction interface of the capacitance 208 is higher than a doping p-type impurity concentration of a p-type semiconductor region at the p-n junction interface of a p-n junction of the photoelectric converter 201.

The p-type semiconductor region of the capacitance 208 is a semiconductor region having a conductivity type opposite to that of signal carriers held in the capacitance 208. The n-type semiconductor region of the capacitance 208 is a semiconductor region having the same conductivity type as signal carriers held in the p-n junction capacitance. In addition, the p-type semiconductor region of the photoelectric converter 201 is a semiconductor region having a conductivity type opposite to that of signal carriers that can be accumulated in the photoelectric converter 201. The n-type semiconductor region of the photoelectric converter 201 is a semiconductor region having the same conductivity type as signal carriers held in the photoelectric converter 201.

Figure 4A:
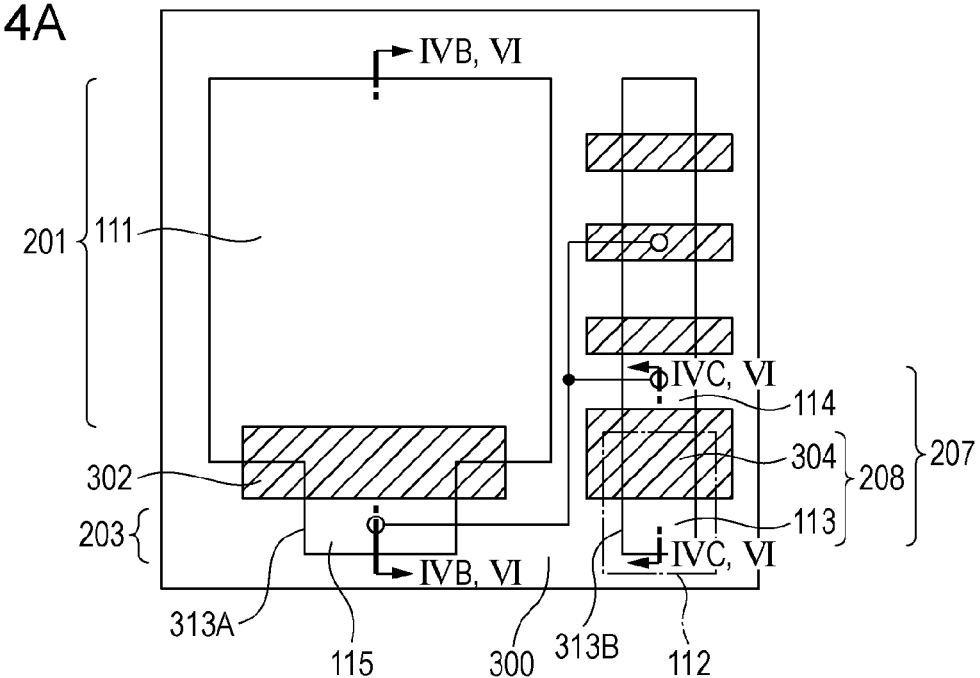
FIG. 4A is a top view of a pixel.
Figure 4B:
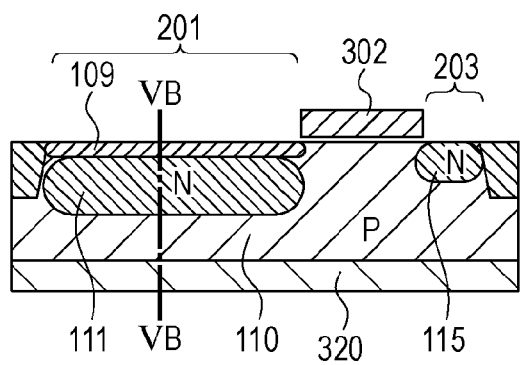
FIGS. 4B and 4C are cross-sectional views of the pixel.
Figure 4C:
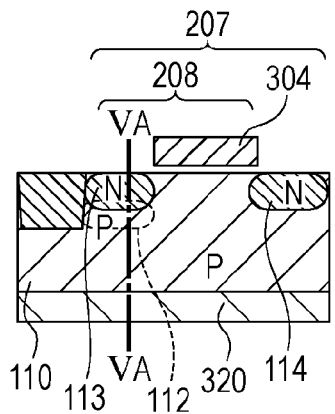

FIGS. 4A to 4C are a plan view and cross-sectional views that illustrate features of the imaging device according to this embodiment.

FIG. 4A is a plan view schematically illustrating a pixel. FIG. 4B is a cross-sectional view taken along line IVB-IVB illustrated in FIG. 4A. FIG. 4C is a cross-sectional view taken along line IVC-IVC illustrated in FIG. 4A. FIG. 4A illustrates active regions 313A and 313B (hereinafter, also referred to as first and second regions 313A and 313B). The photoelectric converter 201 and the FD 203 are disposed in the active region 313A.

The capacitance 208 is disposed in the active region 313B. Transistors included in the pixel, such as the reset transistor 204 and the amplifying transistor 205 illustrated in FIG. 2, may be disposed in the active region 313B. It is assumed that a surface of a semiconductor substrate on which gates of these transistors are disposed is the principal surface. The active regions 313A and 313B are isolated by an isolation region disposed therebetween; however, the active regions 313A and 313B may be formed as a single active region.

Referring to FIG. 4B, the photoelectric converter 201 includes a p-n junction formed of a p-type first semiconductor region 110 (hereinafter, also referred to as the first semiconductor region 110) and an n-type second semiconductor region 111 (hereinafter, also referred to as the second semiconductor region 111).

The FD 203 is formed of an n-type sixth semiconductor region 115 (hereinafter, also referred to as the sixth semiconductor region 115). The FD 203 forms a p-n junction with the first semiconductor region 110 adjacent to the FD 203. The FD 203 holds electrons transferred from the photoelectric converter 201 in a capacitance of this p-n junction.

Referring to FIG. 4C, the capacitance 208 includes a p-n junction capacitance formed of a p-type third semiconductor region 112 (hereinafter, also referred to as the third semiconductor region 112) and an n-type fourth semiconductor region 113 (hereinafter, also referred to as the fourth semiconductor region 113). An n-type fifth semiconductor region 114 (hereinafter, also referred to as the fifth semiconductor region 114) is disposed on a side of a gate 304 opposite to the side including the fourth semiconductor region 113. The fifth semiconductor region 114 forms a p-n junction with the first semiconductor region 110.

In this embodiment, the capacitance 208 is connected to and is disconnected from the fifth semiconductor region 114 in a switching manner, thereby enabling switching of the capacitance value of the input node of the amplifying transistor 205. In the photoelectric converter 201, the first semiconductor region 110 is disposed at a position deeper than a position of the second semiconductor region 111 with respect to the principal surface. In addition, in the capacitance 208, the third semiconductor region 112 is disposed at a position deeper than a position of the fourth semiconductor region 113 with respect to the principal surface.

Figure 5A:
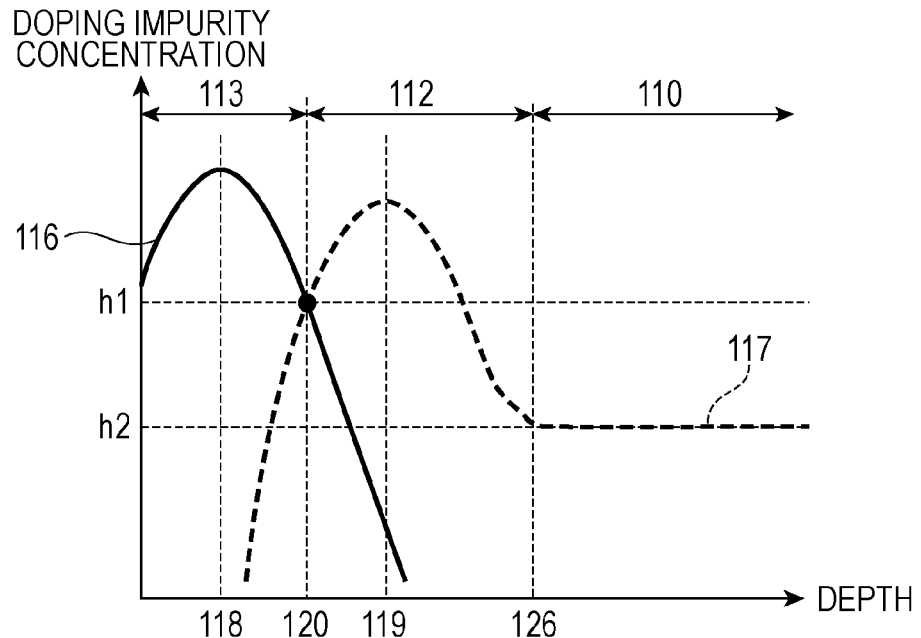
FIGS. 5A and 5B are graphs illustrating doping impurity concentrations.
Figure 5B:
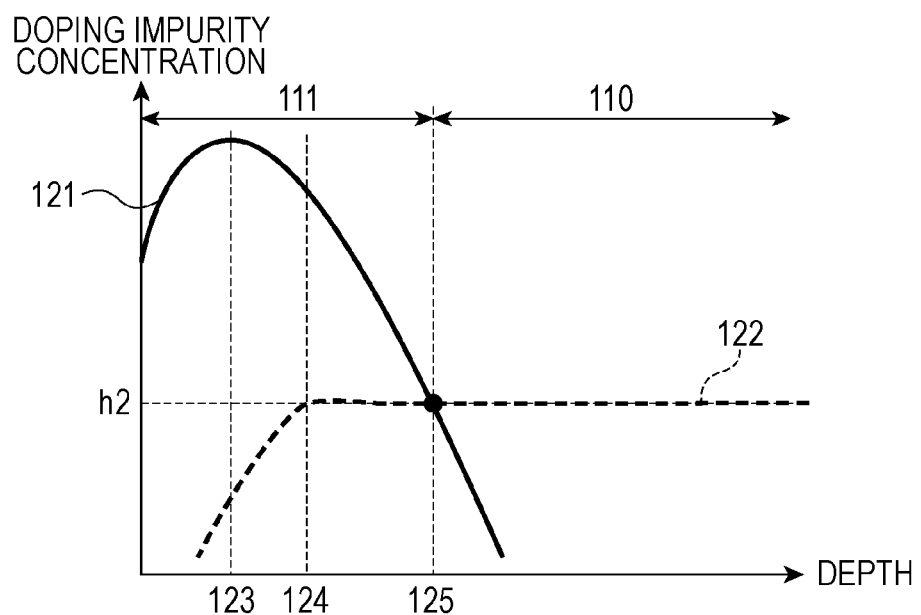

Referring now to FIGS. 5A and 5B, impurity concentration profiles at the photoelectric converter 201 and the capacitance 208 will be described. FIG. 5A illustrates a depth-direction impurity concentration profile of the capacitance 208 along line VA-VA illustrated in FIG. 4C. FIG. 5B illustrates a depth-direction impurity concentration profile of the photoelectric converter 201 along line VB-VB illustrated in FIG. 4B. Solid lines 116 and 121 each indicate a doping n-type impurity concentration, whereas dashed lines 117 and 122 each indicate a doping p-type impurity concentration. Note that the depth direction is a direction toward a deeper part of the semiconductor substrate.

Herein, the term "doping impurity concentration" refers to a concentration of an impurity with which the semiconductor substrate is doped. The doping impurity concentration can be measured by using secondary ion mass spectrometry (SIMS) or scanning capacitance microscopy (SCM), for example. With these methods, the amount of impurity contained in unit volume can be investigated. In contrast, the term "impurity concentration" used herein refers to an impurity concentration resulting from compensation of the doping impurity concentration with an impurity of the opposite conductivity type. For example, if the doping n-type impurity concentration is higher than the doping p-type impurity concentration in a certain region, the region is an n-type semiconductor region. In addition, if the doping p-type impurity concentration is higher than the doping n-type impurity concentration in a certain region, the region is a p-type semiconductor region. A region in which the doping n-type impurity concentration is equal to the doping p-type impurity concentration serves as a p-n junction interface.

Referring to FIG. 5A, the doping impurity concentration distribution of the fourth semiconductor region 113 has a peak at a point 118, and the doping impurity concentration distribution of the third semiconductor region 112 has a peak at a point 119. The doping p-type impurity concentration keeps decreasing from the point 119 and becomes substantially constant at a point 126 to be equal to a doping impurity concentration h2. The doping p-type impurity concentration is substantially equal to the doping n-type impurity concentration at a point 120, and the p-n junction interface is formed at this point.

Referring to FIG. 5B, the doping impurity concentration distribution of the second semiconductor region 111 has a peak at a point 123, and the doping impurity concentration distribution of the first semiconductor region 110 has no peak and is substantially constant at the doping impurity concentration h2. The doping p-type impurity concentration is substantially equal to the doping n-type impurity concentration at a point 125, and the p-n junction interface is formed at this point.

The doping p-type impurity concentration and the doping n-type impurity concentration at the point 120, that is, at the p-n junction interface of the capacitance 208, are equal to h1. The doping p-type impurity concentration and the doping n-type impurity concentration at the point 125, that is, at the p-n junction interface of the photoelectric converter 201, are equal to h2. Accordingly, the doping impurity concentration h1 of the capacitance 208 and the doping impurity concentration h2 of the photoelectric converter 201 satisfy a relationship of h1>h2.

A description will be given by focusing on impurity concentrations of the p-type and n-type semiconductor regions that form a p-n junction.

FIGS. 4C and 5A indicate that the p-n junction of the capacitance 208 is formed of the third semiconductor region 112 and the fourth semiconductor region 113. FIGS. 4B and 5B indicate that the p-n junction of the photoelectric converter 201 is formed of the first semiconductor region 110 and the second semiconductor region 111.

Now, the p-type semiconductor region that forms the p-n junction is focused on. An impurity concentration of the p-type third semiconductor region 112 of the capacitance 208 is equal to or greater than an impurity concentration of the p-type first semiconductor region 110 of the photoelectric converter 201.

If either of these relationships is satisfied, the capacitance value of the capacitance 208 can be increased without decreasing the sensitivity of the photoelectric converter 201. Reasons for this will be described below.

The photoelectric converter 201 can use, as signal carriers, electrons that have moved to the n-type second semiconductor region 111 among electrons generated by photoelectric conversion. It is assumed that electrons are generated at a deep part of the p-type first semiconductor region 110 in such a configuration. If the p-type first semiconductor region 110 has a high impurity concentration, carriers in the p-type first semiconductor region 110 serve as a potential barrier for the electrons when the electrons move to the n-type second semiconductor region 111.

The potential barrier becomes high if the impurity concentration of the p-type first semiconductor region 110 is high, and the number of electrons that reach the n-type second semiconductor region 111 decreases if the potential barrier is high. That is, the sensitivity of the photoelectric converter 201 decreases if the impurity concentration of the p-type first semiconductor region 110 is high. Typically, if the doping p-type impurity concentration becomes lower at the p-n junction interface, the impurity concentration of the p-type semiconductor region forming this p-n junction becomes lower. Accordingly, if the doping p-type impurity concentration is low at the p-n junction interface of the photoelectric converter 201, the potential barrier caused in the p-type first semiconductor region 110 becomes low and the sensitivity of the photoelectric converter 201 becomes high.

In contrast, if the impurity concentration of the p-type third semiconductor region 112 of the capacitance 208 is low, the capacitance value of the p-n junction capacitance of the capacitance 208 becomes small. If the capacitance value of the capacitance 208 is small, an increase in the capacitance value of the input node of the amplifying transistor 205 obtained when the capacitance 208 is in the connected state also becomes small. Accordingly, the doping impurity concentration of the p-type third semiconductor region 112 is high. Typically, if the doping p-type impurity concentration is high at the p-n junction interface, the impurity concentration of the p-type semiconductor region forming this p-n junction is also high. Accordingly, the doping p-type impurity concentration is high at the p-n junction interface of the capacitance 208.

However, p-type semiconductor regions of individual elements of a pixel are often formed of a single region. If the p-type first semiconductor region 110 of the photoelectric converter 201 and the p-type third semiconductor region 112 of the capacitance 208 are formed of a single semiconductor region, it may be difficult to meet required characteristics described above.

In this embodiment, however, the doping p-type impurity concentration at the p-n junction interface of the capacitance 208 is made higher than the doping p-type impurity concentration at the p-n junction interface of the photoelectric converter 201. Such a configuration can increase the capacitance value of the capacitance 208 without decreasing the sensitivity of the photoelectric converter 201.

There may be a case where the doping p-type impurity concentration of the p-type third semiconductor region 112 has a peak at a certain depth. In such a case, if this peak doping impurity concentration is higher than the doping impurity concentration of the p-type first semiconductor region 110, the above-described benefit can be obtained. There may be a case where the doping p-type impurity concentration of the p-type first semiconductor region 110 and the doping p-type impurity concentration of the p-type third semiconductor region 112 have respective peaks. In such a case, the doping impurity concentration peak of the p-type third semiconductor region 112 is made higher than the doping p-type impurity concentration peak of the p-type first semiconductor region 110.

There may be a case where the doping p-type impurity concentration of the p-type first semiconductor region 110 has a plurality of peaks in the depth direction. In such a case, the impurity concentration peak of the p-type third semiconductor region 112 is set higher than the doping p-type impurity concentration peak of the p-type first semiconductor region 110 at a point closest to the n-type second semiconductor region 111.

Now, a process of fabricating the imaging device according to the embodiment will be described with reference to the cross-sections illustrated in FIGS. 4B and 4C and FIGS. 6A to 6C.

Firstly, a semiconductor substrate 320 having an insulating isolation region 300 thereon is prepared. The semiconductor substrate 320 includes the first region 313A, in which the photoelectric converter 201 is disposed, and the second region 313B, in which the capacitance 208 is disposed. The second region 313B is at a position different from the position of the first region 313A in plan view.

Figure 6A:
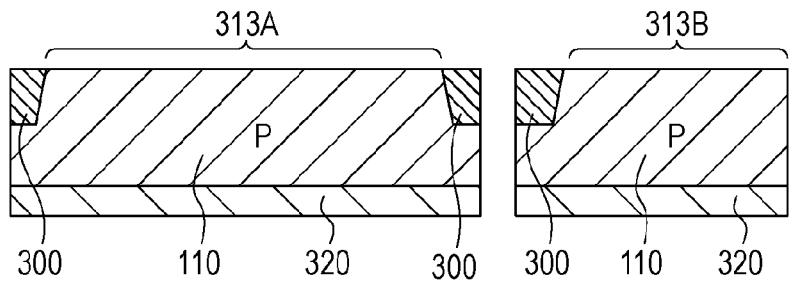
FIGS. 6A to 6C are diagrams illustrating a process of fabricating the imaging device.
Figure 6B:
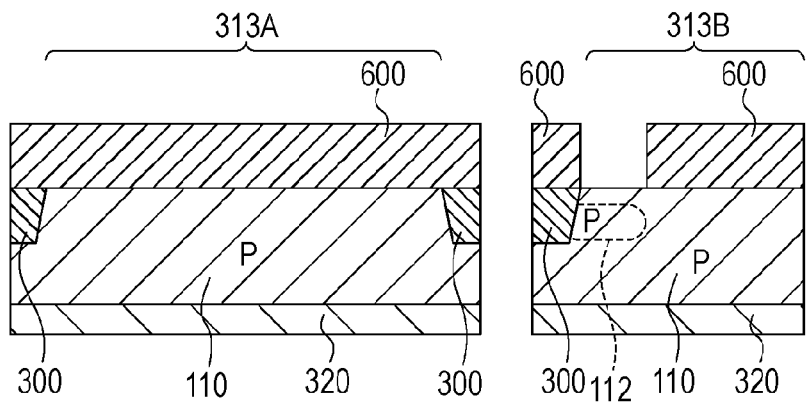

In a first step, p-type impurity ions are implanted to the first region 313A and the second region 313B or a p-type epitaxial layer is disposed at the first region 313A and the second region 313B. As a result of the first step, the p-type first semiconductor region 110 is disposed (FIG. 6A). Then, the first region 313A and a part of the second region 313B other than a part where the capacitance 208 is disposed are covered with a mask 600 such as a photoresist. P-type impurity ions are implanted using the mask 600. As a result, the p-type third semiconductor region 112 having a higher doping p-type impurity concentration than the p-type first semiconductor region 110 is disposed at least at a part of the p-type first semiconductor region 110 in the second region 313B (FIG. 6B).

Figure 6C:
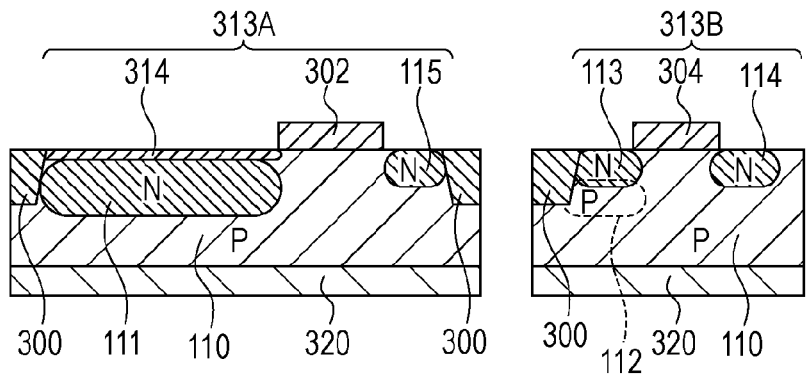

In a second step, polysilicon is disposed all over the principal surface of the semiconductor substrate 320, and patterning is performed to form a gate 302 of the transistor and the gate 304 for the capacitance 208. Then, n-type impurity ions are implanted to the first region 313A by using the gates 302 and 304 as masks, and consequently the n-type second semiconductor region 111 is disposed. Then, n-type impurity ions are implanted by using the gates 302 and 304 as masks, and consequently the n-type fourth to sixth semiconductor regions 113 to 115 are disposed (FIG. 6C).

The n-type second semiconductor region 111 may be disposed in the same step as the step of disposing the n-type fourth to sixth semiconductor regions 113 to 115; however, in one embodiment, the n-type second semiconductor region 111 which forms the photoelectric converter 201 is disposed in a different step from the step of disposing other n-type regions, that is, the n-type fourth to sixth semiconductor regions 113 to 115 because the n-type second semiconductor region 111 extends to a position deeper than a position to which the other n-type regions, that is, the n-type fourth to sixth semiconductor regions 113 to 115, extend with respect to the principal surface. This configuration relates to the sensitivity of the photoelectric converter 201.

The n-type second semiconductor region 111 and the p-type first semiconductor region 110 are disposed in this order from the principal surface in the depth direction so as to form the p-n junction of the photoelectric converter 201. The n-type fourth semiconductor region 113 and the p-type third semiconductor region 112 are disposed in this order from the principal surface in the depth direction so as to form the p-n junction of the capacitance 208.

The n-type semiconductor regions may be disposed by using the gates of the transistors and the capacitance 208 or by using a mask such as a photoresist. In the case where there is a step of disposing the n-type second semiconductor region 111 as in this embodiment, the n-type second semiconductor region 111 alone may be disposed by using a mask such as a photoresist, and other n-type regions may be disposed by using the gates as masks.

After the n-type second semiconductor region 111 has been disposed, p-type impurity ions are implanted to a surface-side region of the semiconductor substrate 320 corresponding to the position of the n-type second semiconductor region 111 so as to dispose a p-type semiconductor region 314 (described later).

The process described above is the process of fabricating the imaging device according to the embodiment. The configuration and the fabrication method illustrated in FIGS. 1 to 6C are also applicable to exemplary embodiments below. It is assumed in the following description that electrons, among electrons and holes generated by the photoelectric converter 201, are handled as signal carriers. In addition, electrons are held in the capacitance 208. The signal carriers can be changed by configuring the semiconductor regions of the photoelectric converter 201 and the capacitance 208 to have opposite conductivity types.

First Exemplary Embodiment

Figure 7A:
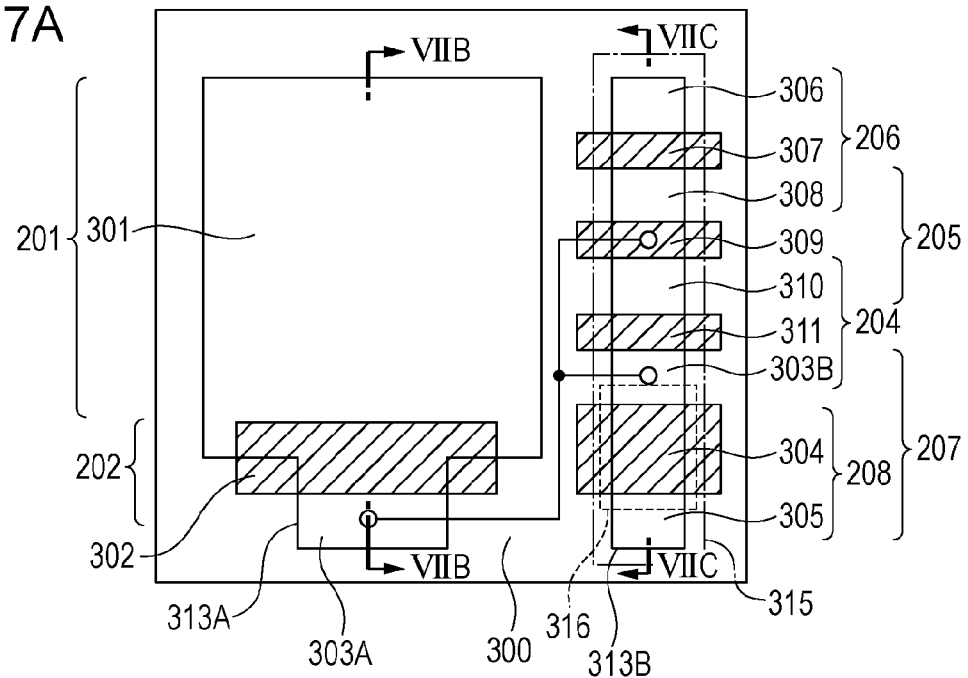
FIG. 7A is a top view of a pixel.
Figure 7B:
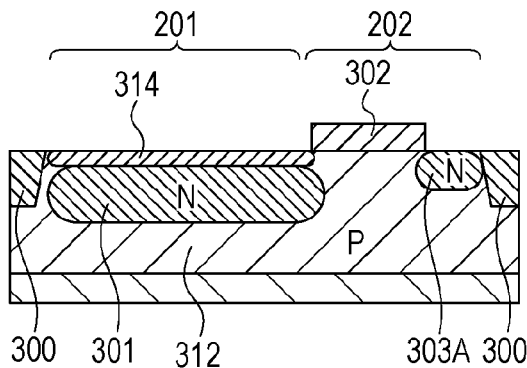
FIGS. 7B and 7C are cross-sectional views of the pixel.
Figure 7C:
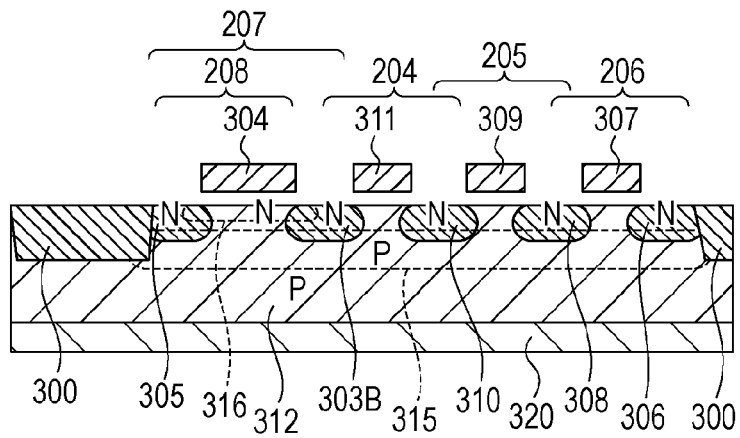

Referring to FIGS. 7A to 7C, an imaging device according to a first exemplary embodiment will be described.

FIG. 7A is a plan view schematically illustrating a pixel. FIG. 7B is a cross-sectional view taken along line VIIB-VIIB illustrated in FIG. 7A. FIG. 7C is a cross-sectional view taken along line VIIC-VIIC illustrated in FIG. 7A. A description regarding elements having the same or substantially the same functions as those described in FIGS. 1 to 6C is omitted.

In the first exemplary embodiment, a p-type semiconductor region 312 corresponds to the first semiconductor region 110, and a p-type semiconductor region 315 corresponds to the third semiconductor region 112. An n-type semiconductor region 303A corresponds to the sixth semiconductor region (FD) 115, and an n-type semiconductor region 303B corresponds to the fifth semiconductor region 114. An n-type semiconductor region 305 corresponds to the fourth semiconductor region 113, and an n-type semiconductor region 301 corresponds to the second semiconductor region 111.

In the imaging device according to the first exemplary embodiment, the semiconductor substrate 320 includes the first region 313A and the second region 313B. As illustrated in FIG. 7A, the photoelectric converter 201, the transfer transistor 202, and the n-type semiconductor region 303A are disposed in the first region 313A. The n-type semiconductor region 303B, the reset transistor 204, the amplifying transistor 205, the selection transistor 206, the switching transistor 207, and the capacitance 208 are disposed in the second region 313B.

The n-type semiconductor region 303A disposed in the first region 313A and the n-type semiconductor region 303B and a gate 309 of the amplifying transistor 205 disposed in the second region 313B are electrically connected to one another by a conductor. In the first exemplary embodiment, the first region 313A in which the photoelectric converter 201 is disposed and the second region 313B in which the capacitance 208 is disposed are formed as separate active regions; however, the first region 313A and the second region 313B need not be separate active regions and may be formed as a single active region. The same applies to all the other exemplary embodiments.

Referring to FIG. 7B, the photoelectric converter 201 includes a p-n junction formed of the n-type semiconductor region 301 and the p-type semiconductor region 312. In the first exemplary embodiment, the photoelectric converter 201 is a photodiode. The p-type semiconductor region 314 is disposed on the surface of the n-type semiconductor region 301, forming a buried-type photodiode.

The n-type semiconductor region 301 extends to a position deeper than positions to which the n-type semiconductor region 305 and semiconductor regions that form sources and drains of transistors extend with respect to the principal surface having the gates thereon.

Referring to FIG. 7C, the reset transistor 204 includes the n-type semiconductor region 303B which serves as the source, a gate 311, and an n-type semiconductor region 310 which serves as the drain. The amplifying transistor 205 includes the n-type semiconductor region 310 which serves as the drain, the gate 309, and an n-type semiconductor region (ninth semiconductor region) 308 which serves as the source. The selection transistor 206 includes the n-type semiconductor region 308 which serves as the drain, a gate 307, and an n-type semiconductor region (eighth semiconductor region) 306 which serves as the source.

The switching transistor 207 includes the gate 304. The connection state of the capacitance 208 is switched in accordance with a voltage applied to the gate 304. The n-type semiconductor region 305 and the n-type semiconductor region 303B are disposed on the respective sides of the gate 304. The n-type semiconductor region 303B and the n-type semiconductor region 305 serve as the drain and the source of the switching transistor 207. The capacitance 208 may include the gate 304.

The p-type semiconductor region 315 is disposed over the entire area below the amplifying transistor 205, the reset transistor 204, the selection transistor 206, the switching transistor 207, and the capacitance 208. The p-type semiconductor region 315 is disposed at a position so as to form p-n junctions with the n-type semiconductor regions which serve as the source and the drain of the corresponding transistors.

An impurity concentration of the p-type semiconductor region 315 is higher than that of the p-type semiconductor region 312. Specifically, an impurity concentration D1 of the p-type semiconductor region 315 is in a range of $3.3 \times 10^{16}/cm^3 \leq D1 \leq 3.0 \times 10^{17}/cm^3$, and an impurity concentration D2 of the p-type semiconductor region 312 is in a range of $3.3 \times 10^{15}/cm^3 \leq D2 \leq 3.0 \times 10^{16}/cm^3$.

Disposing the p-type semiconductor region 315 substantially all over the second region 313B can suppress pixel-to-pixel variations in the position of the p-type semiconductor region 315 and can reduce pixel-to-pixel variations in the capacitance value of the capacitance 208.

In the first exemplary embodiment, the p-type semiconductor region 315 can achieve an increased capacitance value of the capacitance 208 and increase an increase in the dynamic range when the capacitance 208 is in the connected state.

How the p-type semiconductor region 315 increases the capacitance value will be described by using Equation (1).

Equation 1 denotes a width of a depletion layer at the p-n junction.

$$W_{p+n} = \sqrt{\frac{2\varepsilon_{Si}\varepsilon_0}{q}\left(\frac{N_A + N_D}{N_A N_D}\right)(V_{bi} - V)} \quad \text{Equation 1}$$

In Equation 1, $\varepsilon_{Si}$ denotes the relative permittivity of silicon, $\varepsilon_0$ denotes the vacuum permittivity, q denotes the elementary charge, $N_A$ denotes the accepter concentration, $N_D$ denotes the donor concentration, $V_{bi}$ denotes the built-in potential, and V denotes a voltage applied to the p-n junction. In the case where V is constant, an increase in the acceptor concentration or the donor concentration leads to a decreased depletion-layer width $W_{p+n}$ as indicated by Equation 1. The junction capacitance is inversely proportional to the depletion-layer width $W_{p+n}$. Thus, the junction capacitance increases as the depletion-layer width $W_{p+n}$ decreases. That is, in the case of increasing the junction capacitance of unit area, the acceptor concentration or the donor concentration is increased to decrease the depletion-layer width.

In the first exemplary embodiment, the p-type semiconductor region 315 is provided in addition to the p-type semiconductor region 312. In this way, the accepter concentration is increased, and consequently the capacitance value of the p-n junction capacitance between the p-type semiconductor region 315 and the n-type semiconductor region 305 is increased.

In addition, an n-type semiconductor region (seventh semiconductor region) 316 may be disposed below the gate 304 so as to overlap with the gate 304 in plan view. A reason for this will be described below.

Noise called kTC noise mixes into the capacitance 208 due to variations in the reset level of the n-type semiconductor region 303B. In order to suppress this noise, in one embodiment, the capacitance 208 is also reset when an operation for resetting the signal of the n-type semiconductor region 303B is performed.

Let VGres denote a voltage applied to the gate 311 of the reset transistor 204 and VTHres denote a threshold of the reset transistor 204. In this case, a reset level Vresfd of the n-type semiconductor region 303B is denoted by (VGres−VTHres).

In addition, let VGapp denote a voltage applied to the gate 304 of the switching transistor 207 when the capacitance 208 is connected to the input node of the amplifying transistor 205 and VTHapp denote a threshold of the switching transistor 207. In this case, a reset level Vresapp of the capacitance 208 is denoted by (VGapp−VTHapp).

In order to reset the capacitance 208 to have the reset level of the n-type semiconductor region 303B, a relationship of Vresfd<Vresapp is to be satisfied. That is, the reset level of the capacitance 208 satisfies a relationship of (VGres−VTHres)<(VGapp−VTHapp). Suppose that the voltages VGres and VGaap are equal. Then, VTHres>VTHapp is obtained. Accordingly, the threshold of the switching transistor 207 is set to be lower than the threshold for the reset level in the operation for resetting the signal of the n-type semiconductor region 303B.

Suppose that the voltages VGres and VGapp are equal when the reset level of the capacitance 208 satisfies (VGres−VTHres)>(VGapp−VTHapp). Then, VTHres<VTHapp is satisfied. In this case, the capacitance 208 is not reset to have a certain reset level, and noise due to variations in the reset level may be caused, which is not desirable.

As described above, the n-type semiconductor region 316 is provided in order to allow the reset transistor 204 and the switching transistor 207 to have different thresholds and obtain high-quality image signals whose pixel-to-pixel variations are suppressed.

For this reason, the n-type semiconductor region 316 and the p-type semiconductor region are formed to have impurity concentrations that satisfy VTHres>VTHapp.

In the first exemplary embodiment, it has been described that the n-type semiconductor region 316 has the same conductivity type as the n-type semiconductor region 303B for convenience of explanation.

However, the n-type semiconductor region 316 need not have an n-type structure and may take any structure as long as the n-type semiconductor region 316 lowers the threshold of the switching transistor 207. For example, a p-type semiconductor region having a lower impurity concentration than the other p-type semiconductor regions may be employed.

In addition, it is assumed that the p-type semiconductor region 312 is disposed in the second region 313B; however, the p-type semiconductor region 312 in the second region 313B need not be the same as the p-type semiconductor region 312 in the first region 313A. The impurity concentration of the p-type semiconductor region 315 is to be higher than that of a p-type semiconductor region in the second region that is arranged in substitution for the p-type semiconductor region 312.

This also applies to following exemplary embodiments.

In the first exemplary embodiment, the n-type semiconductor region 305 of the capacitance 208 forms a p-n junction with the p-type semiconductor region 315. This configuration thus can increase the capacitance value of the capacitance 208 and consequently increase an increase in the dynamic range when the capacitance 208 is in the connected state. Further, the p-type semiconductor region 315 is disposed substantially all over the second region 313B. This configuration can suppress pixel-to-pixel variations in the position of the p-type semiconductor region 315.

Second Exemplary Embodiment

Figure 8A:
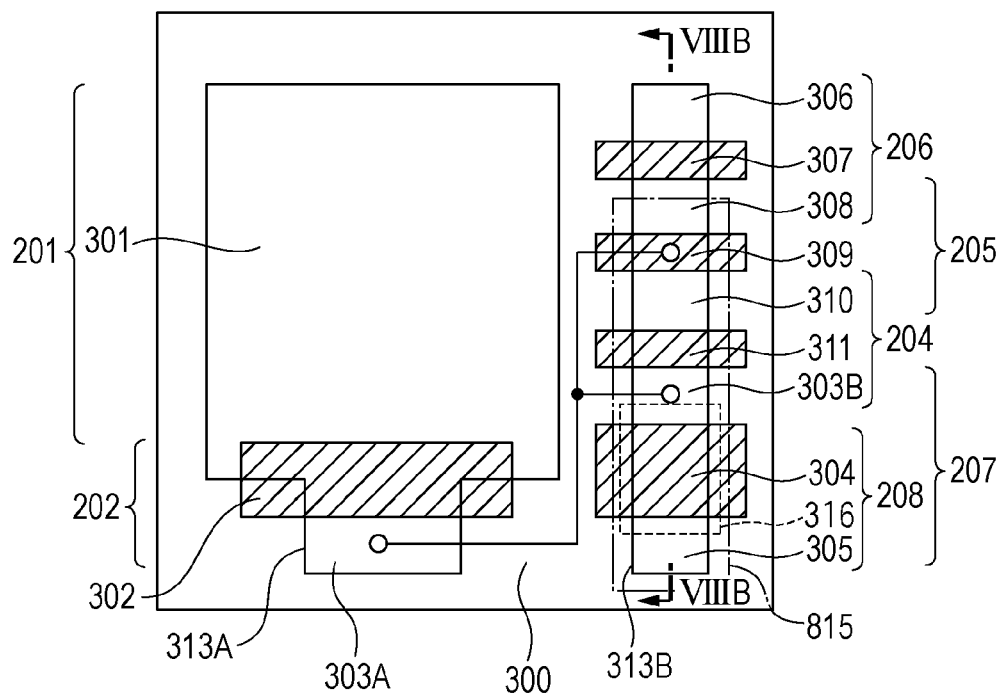
FIG. 8A is a top view of a pixel.
Figure 8B:
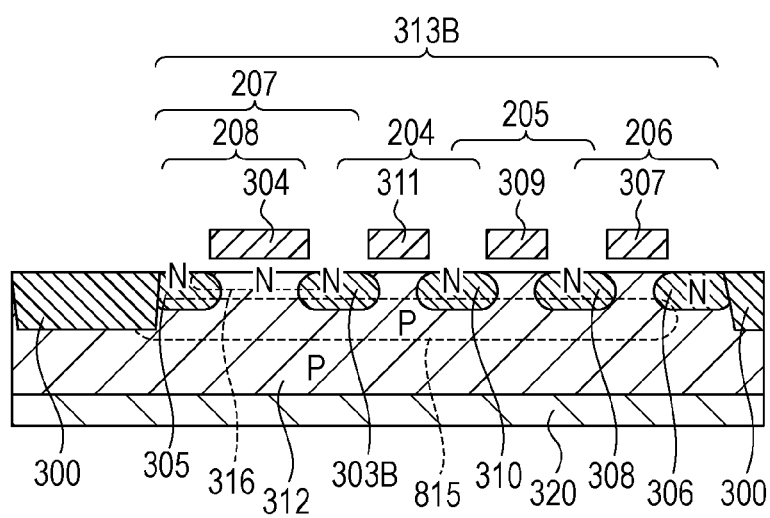
FIG. 8B is a cross-sectional view of the pixel.

Referring to FIGS. 8A and 8B, an imaging device according to a second exemplary embodiment will be described.

FIG. 8A is a plan view schematically illustrating a pixel of the imaging device. FIG. 8B is a cross-sectional view taken along line VIIIB-VIIIB. A description regarding elements similar to those illustrated and described in FIGS. 1 to 7C is omitted.

In the second exemplary embodiment, a p-type semiconductor region 815 corresponds to the third semiconductor region 112.

The second exemplary embodiment differs from the first exemplary embodiment in the position of the p-type semiconductor region 815 in plan view. In the second exemplary embodiment, the p-type semiconductor region 815 extends from a position below the capacitance 208 to a position below the selection transistor 206. The p-type semiconductor region 312 having a lower impurity concentration than the p-type semiconductor region 815 is disposed at a position where the p-type semiconductor region 312 forms a p-n junction with at least a part of the n-type semiconductor region 306 that forms an output node of the selection transistor 206.

As illustrated in FIG. 8B, the second exemplary embodiment further achieves an improved frame rate in addition to the benefits of the first exemplary embodiment. The details will be described below.

In the second exemplary embodiment, the p-type semiconductor region 312 having a lower impurity concentration than the p-type semiconductor region 815 forms a p-n junction with at least a part of the n-type semiconductor region 306. This configuration can reduce capacitance of the n-type semiconductor region 306, compared with the case where the entire lower part of the n-type semiconductor region 306 forms a p-n junction with the p-type semiconductor region 815 as in the first exemplary embodiment. Reducing capacitance of the n-type semiconductor region 306 in this way can reduce capacitance of the signal line 211 illustrated in FIG. 2 and consequently make a time constant for driving smaller. That is, the configuration can contribute to speedup of driving of the signal line 211 and thus can improve the frame rate.

Capacitance of the n-type semiconductor region 306 can be reduced by terminating the p-type semiconductor region 815 at a part between the amplifying transistor 205 and the selection transistor 206. Further, such a configuration can also suppress variations in capacitance of the p-n junction of the n-type semiconductor region 306 even if arrangement of the p-type semiconductor region 815 varies from pixel to pixel.

In addition, the selection transistor 206 may be omitted. In such a case, the n-type semiconductor region 308 which is the source of the amplifying transistor 205 serves as the output node.

In this case, the p-type semiconductor region 312 having a lower impurity concentration than the p-type semiconductor region 815 forms a p-n junction with at least a part of the n-type semiconductor region 308. Such a configuration can reduce capacitance of the signal line 211.

Further, the p-type semiconductor region 815 may be terminated at a part between the reset transistor 204 and the amplifying transistor 205. Such a configuration can also provide a benefit similar to that obtained by terminating the p-type semiconductor region 815 at a part between the amplifying transistor 205 and the selection transistor 206. In addition, the p-type semiconductor region 312 of the photoelectric converter 201 may be used as the p-type semiconductor region having a lower impurity concentration.

Third Exemplary Embodiment

Referring to FIG. 9A to 10C, an imaging device according to a third exemplary embodiment will be described.

Figure 9A:
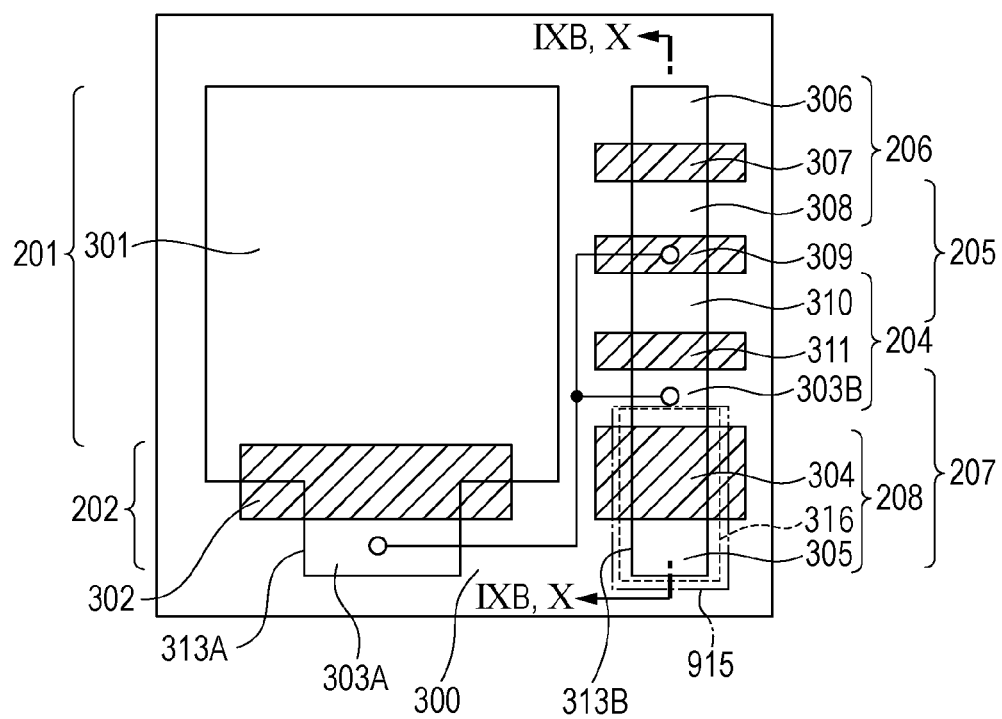
FIG. 9A is a top view of a pixel.
Figure 9B:
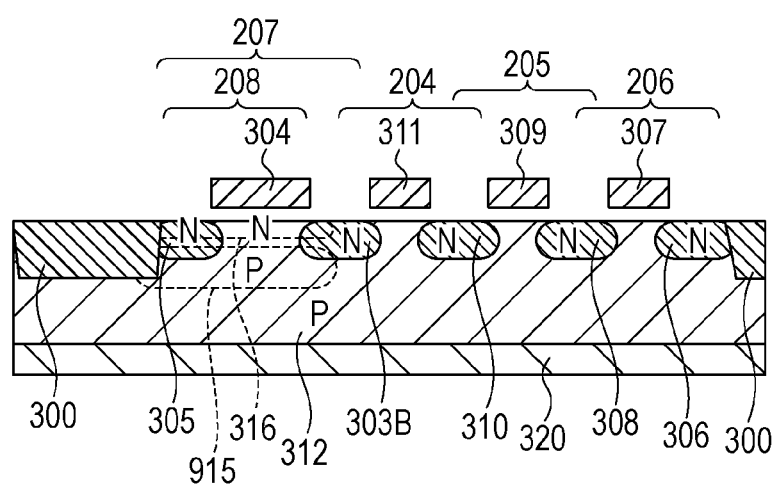
FIG. 9B is a cross-sectional view of the pixel.

FIG. 9A is a plan view schematically illustrating a pixel. FIG. 9B is a cross-sectional view taken along line IXB-IXB. A description regarding elements similar to those illustrated and described in FIGS. 1 to 8B is omitted.

In a configuration of the third exemplary embodiment, a p-type semiconductor region 915 corresponds to the third semiconductor region 112.

The third exemplary embodiment differs from the first and second exemplary embodiments described above in the position of the p-type semiconductor region 915 in plan view.

According to the configuration of the third exemplary embodiment, the p-type semiconductor region 915 extends over an area below the n-type semiconductor region 305 and at least a part of the n-type semiconductor region 303B. Another part of the n-type semiconductor region 303B is disposed at a position where the n-type semiconductor region 303B forms a p-n junction with the p-type semiconductor region 312 having a lower impurity concentration than the p-type semiconductor region 915.

The third exemplary embodiment can achieve an improved image quality when the capacitance 208 is not connected to the input node of the amplifying transistor 205 in addition to the benefits of the first and second exemplary embodiments described above. The details will be described below.

In the third exemplary embodiment, the p-type semiconductor region 312 having a lower impurity concentration than the p-type semiconductor region 915 forms a p-n junction with at least a part of the n-type semiconductor region 303B as illustrated in FIG. 9B. Such a configuration can reduce p-n junction capacitance of the n-type semiconductor region 303B, compared with the case where the entire lower region of the n-type semiconductor region 303B forms a p-n junction with the p-type semiconductor region 315 as in the first exemplary embodiment.

In the third exemplary embodiment, the reduced capacitance of the n-type semiconductor region 303B improves a gain at which certain unit signal carrier is converted into a voltage. The improved gain improves the S/N ratio and the image quality when the capacitance 208 is in the disconnected state.

In the third exemplary embodiment, the p-type semiconductor region 915 and the n-type semiconductor region 316 are disposed at positions so that they overlap with each other in plan view. Such a configuration can reduce the influence of pixel-to-pixel variances due to displacements of the part where threshold of the switching transistor 207 is made higher by the p-type semiconductor region 915 and the part where the threshold of the switching transistor 207 is made lower by the n-type semiconductor region 316.

That is, the configuration makes the threshold design of the switching transistor 207 easier. In addition, the p-type semiconductor region 915 and the n-type semiconductor region 316 can be disposed by using a single mask. This can simplify the fabrication process and reduce the cost.

Now, a process of fabricating the imaging device according to the third exemplary embodiment will be described with reference to FIGS. 10A to 10C which correspond to the cross section illustrated in FIG. 9B. The fabrication process according to the third exemplary embodiment differs from the above-described one mainly in the first step.

The first step is performed in a manner similar to that described in FIG. 6A (FIG. 10A), and a region other than a part of the second region 313B where the capacitance 208 is disposed is covered with a mask 700 such as a photoresist. Then, p-type impurity ions are implanted to dispose the p-type semiconductor region 915 at a deep position with respect to the principal surface. In the same step, n-type impurity ions are implanted by using the same mask 700 to dispose the n-type semiconductor region 316 at a shallow position with respect to the principal surface. At this time, the n-type semiconductor region 316, the p-type semiconductor region 312 having a lower impurity concentration than the p-type semiconductor region 915, and the p-type semiconductor region 915 are disposed in this order in the depth direction with respect to the principal surface (FIG. 10B).

Figure 10A:
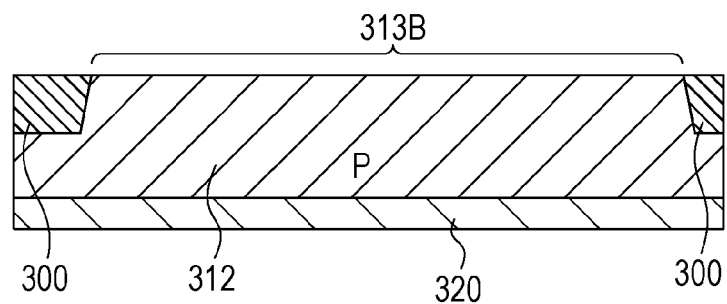
FIGS. 10A to 10C are diagrams illustrating a process of fabricating the imaging device.
Figure 10B:
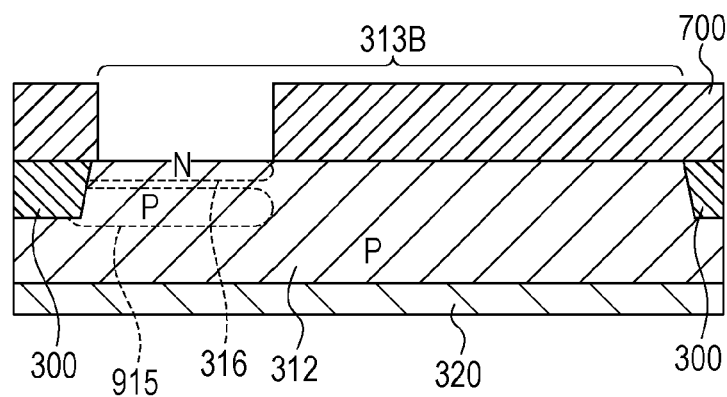
Figure 10C:
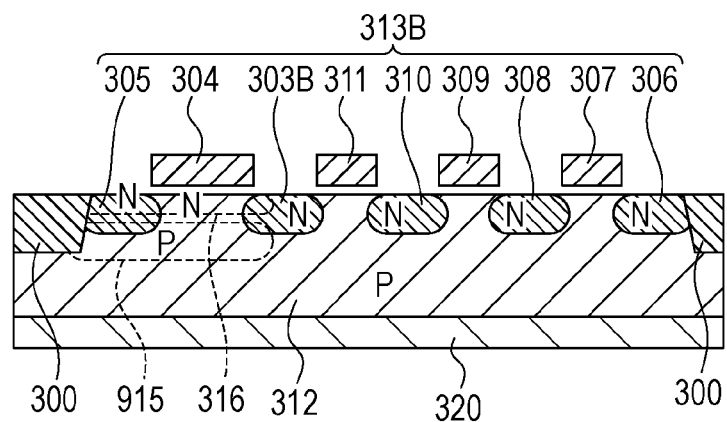

The second step is performed in the same manner as that described in FIG. 6C (FIG. 10C).

Steps not illustrated in FIGS. 10A to 10C, for example, a step of disposing the photoelectric converter 201, are performed between the above-described steps as appropriate.

Structures that are disposed at the same depth as the p-type semiconductor region 915 or the n-type semiconductor region 316 may be disposed by implanting impurity ions by using the same mask in order to simplify the process. For example, a guard-ring structure disposed around the photoelectric converter 201 may be formed in the same step by using the same mask.

By forming the p-type semiconductor region 915 and the n-type semiconductor region 316 in the same step, the process can be simplified and the cost of the imaging device 101 can be reduced.

Fourth Exemplary Embodiment

Figure 11A:
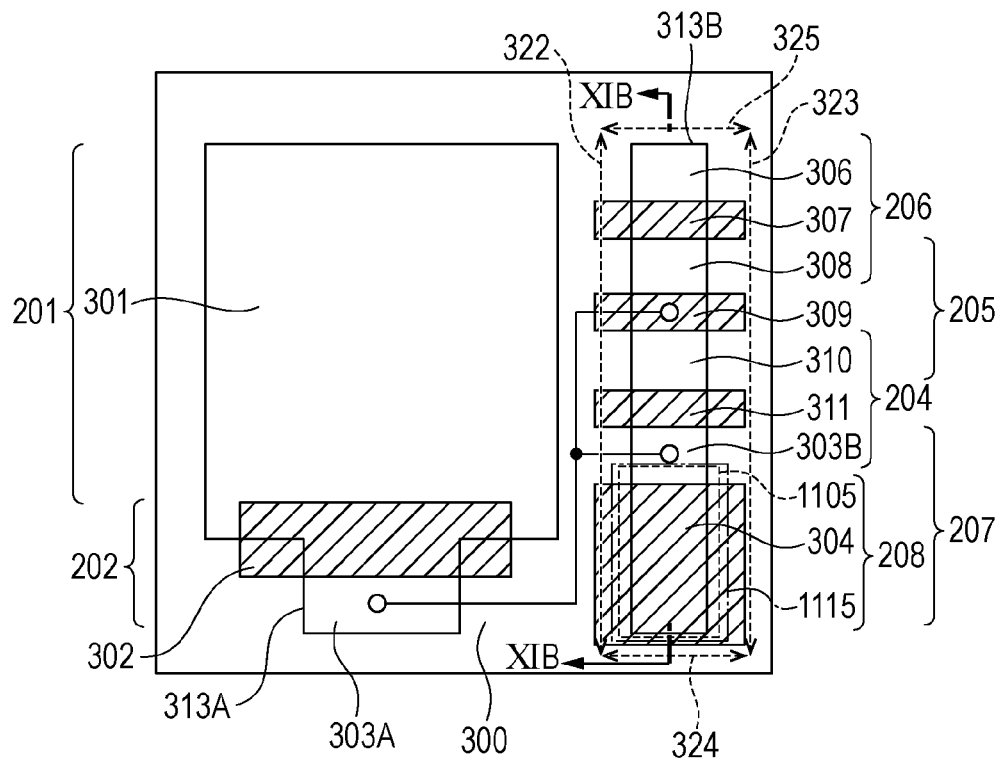
FIG. 11A is a top view of a pixel.
Figure 11B:
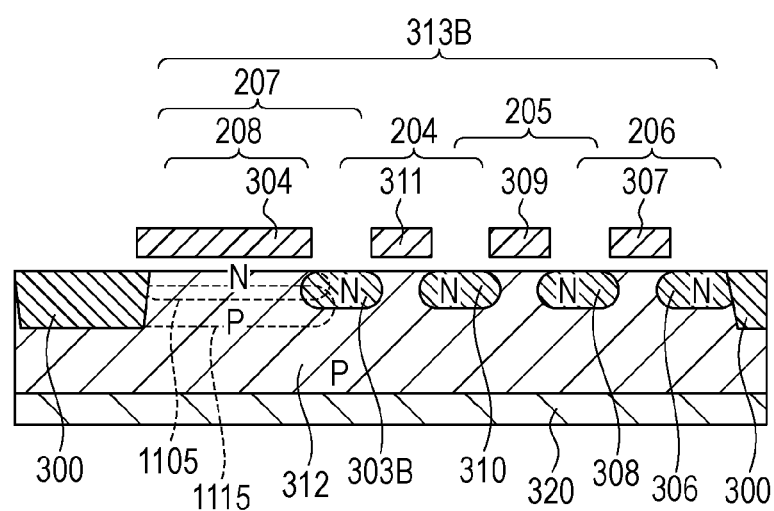
FIG. 11B is a cross-sectional view of the pixel.

Referring to FIGS. 11A and 11B, an imaging device according to a fourth exemplary embodiment will be described.

FIG. 11A is a plan view schematically illustrating a pixel. FIG. 11B is a cross-sectional view taken along line XIB-XIB illustrated in FIG. 11A. A description regarding elements similar to those illustrated and described in FIGS. 1 to 10C is omitted.

In a configuration of the fourth exemplary embodiment, a p-type semiconductor region 1115 corresponds to the third semiconductor region 112, and an n-type semiconductor region 1105 corresponds to the fourth semiconductor region 113.

The fourth exemplary embodiment differs from the first to third exemplary embodiments described above in the configuration of the capacitance 208 and the position of the p-type semiconductor region 1115 in plan view. The capacitance 208 according to the fourth exemplary embodiment is a buried-type metal oxide semiconductor (MOS) capacitor.

As illustrated in FIG. 11A, the active region 313B in which the capacitance 208 is disposed is constituted by opposing third and fourth regions 322 and 323 and opposing fifth and sixth regions 324 and 325 which are surrounded by the insulating isolation region 300. The ends of the active region 313B are defined by these regions. In addition, the active region surrounded by the third region 322, the fourth region 323, and the fifth region 324 are covered with the gate 304, and the n-type semiconductor regions are disposed in the active region between the sixth region 325 and the gate 304.

The above-described configuration can suppress variations in the sum of the gate insulating film capacitance which is added when the gate 304 operates and the capacitance of the n-type semiconductor regions 303B, compared with the third exemplary embodiment.

The term "variations" used herein refers to variations in the configuration width in the longitudinal direction of the gate 304 when the gate 304 is disposed, variations in the amount of impurity ions implanted to the n-type semiconductor region 1105 at a lower part of the capacitance 208, and structural variations in members that form electrodes of the capacitance 208, for example.

The fourth exemplary embodiment can suppress variations in the sum of the capacitance added when the gate 304 operates and the capacitance of the n-type semiconductor region 303B and achieves an improved image quality in addition to the benefits obtained by the first to third exemplary embodiments.

Now, a process of fabricating the imaging device according to the fourth exemplary embodiment will be described. The process of fabricating the imaging device according to the fourth exemplary embodiment differs from that of the third exemplary embodiment in steps illustrated in FIGS. 10B and 10C. The differences will be described below.

In the fourth exemplary embodiment, the p-type semiconductor region 1115 is disposed at a deep position with respect to the principal surface, and the n-type semiconductor region 1105 is disposed at a shallow position with respect to the principal surface by implanting n-type impurity ions by using the same mask 700 in the same procedure as that of FIG. 10B. However, at this time, impurity ion implantation is performed to dispose the n-type semiconductor region 1105 and the p-type semiconductor region 1115 in the depth direction in this order from the principal surface so that the n-type semiconductor region 1105 and the p-type semiconductor region 1115 form a p-n junction.

The n-type semiconductor region 1105 and the p-type semiconductor region 1115 have a different positional relationship as a result of ion implantation using the same mask.

Further, in the fourth exemplary embodiment, the gate 304 is disposed in the second region 313B on the principal surface so as to cover the active region surrounded by the third region 322, the fourth region 323, and the fifth region 324 in the procedure of FIG. 10C, which is also different.

Fifth Exemplary Embodiment

Figure 12A:
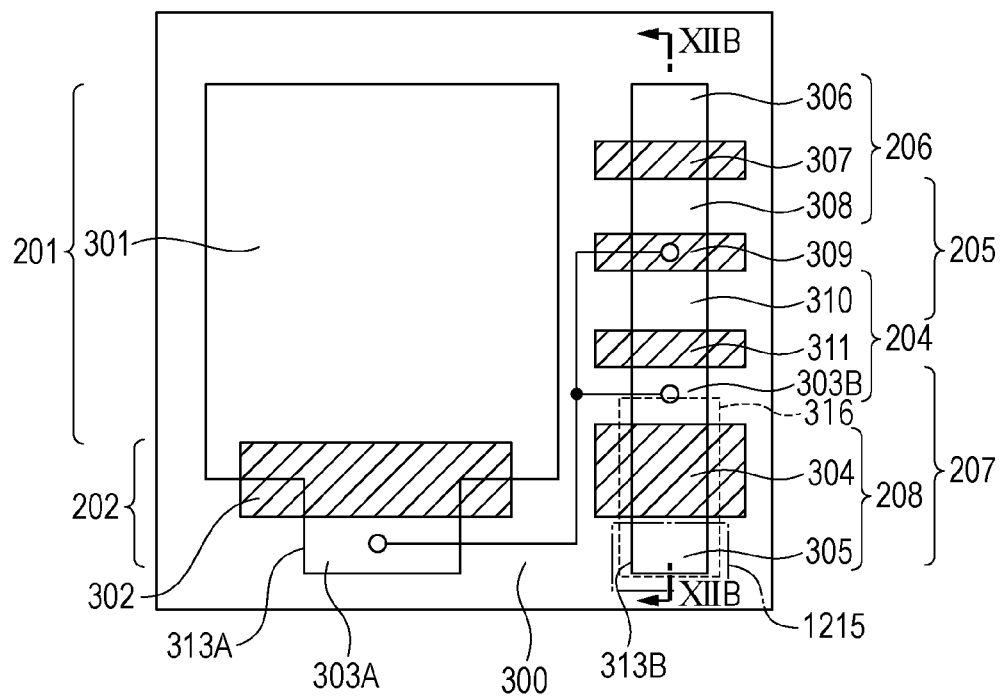
FIG. 12A is a top view of a pixel.
Figure 12B:
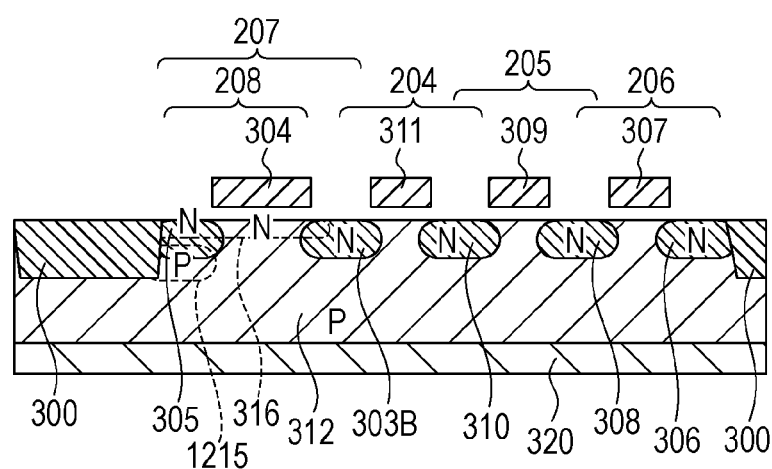
FIG. 12B is a cross-sectional view of the pixel.

Referring to FIGS. 12A and 12B, an imaging device according to a fifth exemplary embodiment will be described.

FIG. 12A is a plan view schematically illustrating a pixel. FIG. 12B is a cross-sectional view taken along line XIIB- XIIB illustrated in FIG. 12A. A description regarding elements similar to those illustrated and described in FIGS. 1 to 11B is omitted.

In a configuration of the fifth exemplary embodiment, a p-type semiconductor region 1215 corresponds to the third semiconductor region 112. The fifth exemplary embodiment differs from the first to fourth exemplary embodiments described above in the position of the p-type semiconductor region 1215 in plan view.

In the fifth exemplary embodiment, the p-type semiconductor region 1215 is disposed below the n-type semiconductor region 305 and forms a p-n junction with at least a part of the n-type semiconductor region 305, as illustrated in FIG. 12B. Another part of the n-type semiconductor region 305 forms a p-n junction with the p-type semiconductor region 312 having a lower doping p-type impurity concentration than the p-type semiconductor region 1215 at the p-n junction interface.

The configuration of the fifth exemplary embodiment can increase only the p-n junction capacitance of the n-type semiconductor region 305 of the capacitance 208. In addition, the fabrication process can be simplified by using the same mask as that used for the n-type semiconductor regions in ion implantation and variations caused in fabrication can be suppressed.

Sixth Exemplary Embodiment

Figure 13A:
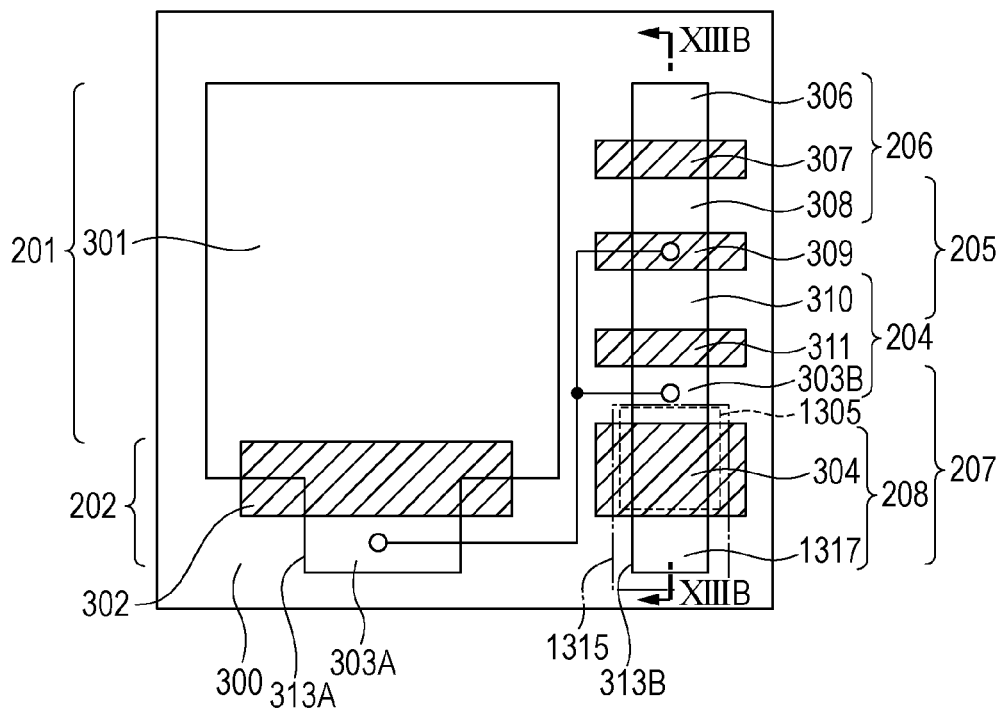
FIG. 13A is a top view of a pixel.
Figure 13B:
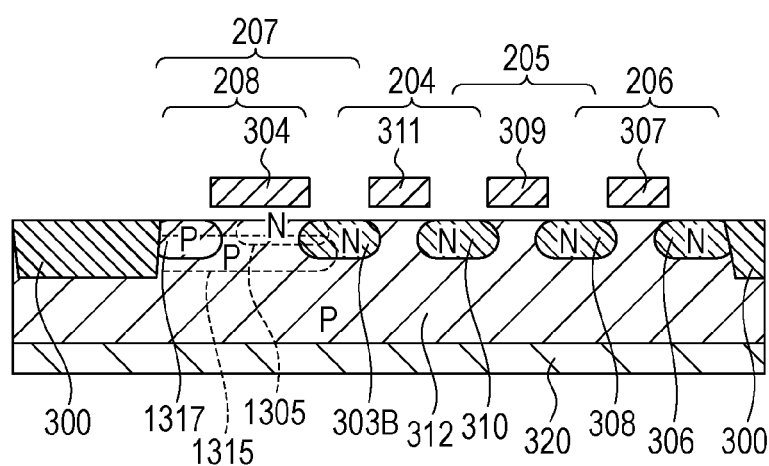
FIG. 13B is a cross-sectional view of the pixel.

Referring to FIGS. 13A and 13B, an imaging device according to a sixth exemplary embodiment will be described. FIG. 13A is a plan view schematically illustrating a pixel. FIG. 13B is a cross-sectional view taken alone line XIIIB-XIIIB illustrated in FIG. 13A. A description regarding elements similar to those illustrated and described in FIGS. 1 to 12B is omitted.

In the sixth exemplary embodiment, a p-type semiconductor region 1315 corresponds to the third semiconductor region 112 of the embodiment, and an n-type semiconductor region 1305 corresponds to the fourth semiconductor region 113 of the embodiment, as illustrated in FIG. 13B. The sixth exemplary embodiment differs from the first to fifth exemplary embodiments described above in that a semiconductor region disposed on a side of the gate 304 opposite to the side including the n-type semiconductor region 303B is a p-type semiconductor region 1317 and the n-type semiconductor region 1305 is disposed below the gate 304, thereby forming a buried-type MOS capacitor.

In the sixth exemplary embodiment, the capacitance 208 is formed of a p-n junction capacitance of the n-type semiconductor region 1305 and the p-type semiconductor region 1315. Accordingly, the p-type semiconductor region 1315 forms a p-n junction with at least a part of the n-type semiconductor region 1305.

In the sixth exemplary embodiment, an area at which the n-type semiconductor region 1305 that forms the capacitance 208 is directly in contact with the insulating isolation region 300 is reduced when the switching transistor 207 connects the capacitance 208 to the n-type semiconductor region 303B. In this way, the sixth exemplary embodiment can reduce noise and achieve an improved image quality. Details will be described below.

In the above-described configuration, typically, the insulating isolation region 300 is formed mainly of silicon dioxide, for example. A defect may be caused at an interface due to a difference in a property, such as the expansion coefficient, between silicon dioxide and silicon which is the semiconductor substrate 320.

If the n-type semiconductor region 303B or the n-type semiconductor region 305 is in contact with the defect part as in the above-described exemplary embodiments, such a state can cause noise. To avoid such a situation, the p-type semiconductor region 1317 which is an opposing electrode of the n-type semiconductor region 303B is disposed between the insulating isolation region 300 and the n-type semiconductor region 1305 of the capacitance 208. Such a configuration allows carriers generated at the defect on the interface of the insulating isolation region 300 to recombine with holes which are the majority carriers in the p-type semiconductor region 1317, thereby reducing the amount of carriers that mix into the n-type semiconductor region 303B.

Note that all regions of the capacitance 208 in FIGS. 13A and 13B need not have the opposite conductivity type of a power supply. If at least a region has the opposite conductivity type, the area at which the n-type semiconductor region 1305 that forms the capacitance 208 is directly in contact with the insulating isolation region 300 is reduced when the switching transistor 207 connects the capacitance 208 to the n-type semiconductor region 303B. For example, the gate 304 of the switching transistor 207 may be disposed to cover the n-type semiconductor region 1305. Alternatively, the p-type semiconductor region 1317 may have a potential other than the ground potential.

Seventh Exemplary Embodiment

Referring to FIGS. 2 and 14A to 14C, a seventh exemplary embodiment of the present invention will be described.

Components having the same or substantially the same functions as those of the embodiment and the first to sixth exemplary embodiments are denoted by the same reference numerals, and a detailed description thereof are omitted.

Figure 14A:
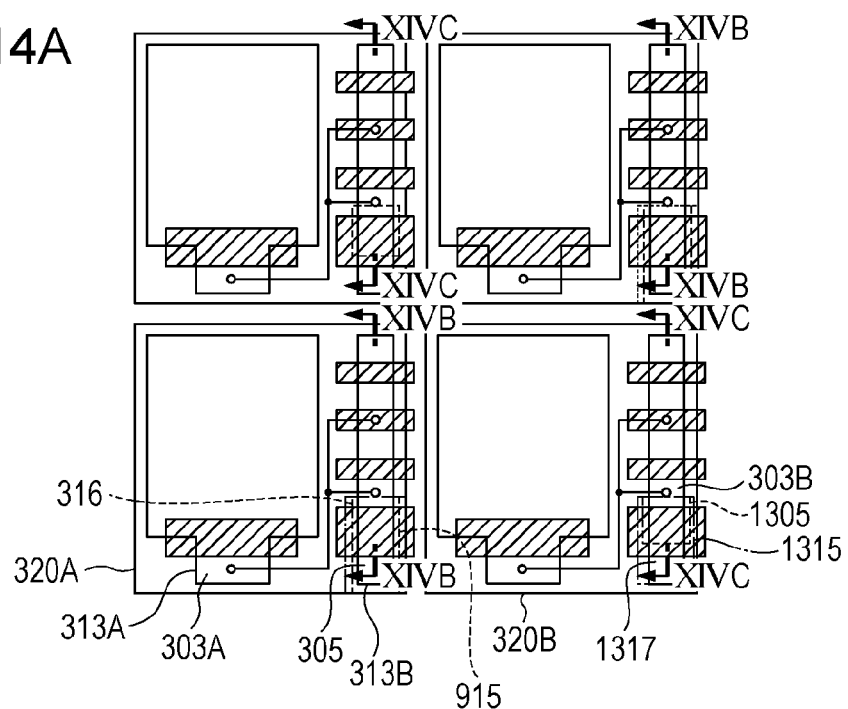
FIG. 14A is a top view of pixels.
Figure 14B:
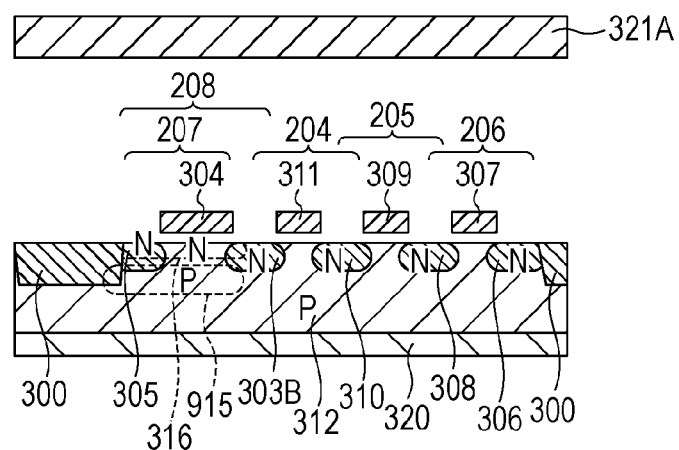
FIGS. 14B and 14C are cross-sectional views of the pixels.
Figure 14C:
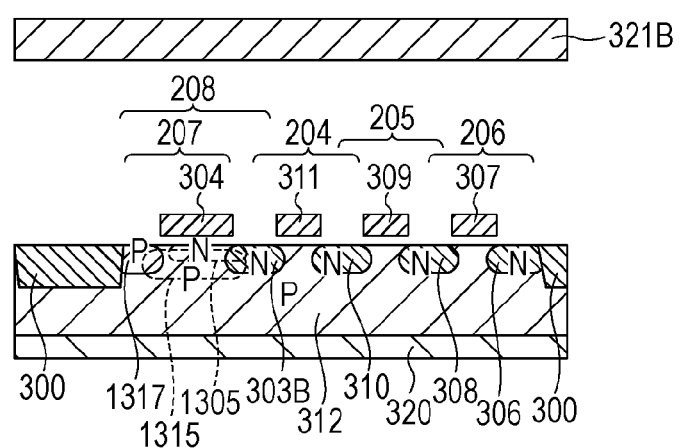

Referring to FIGS. 14A to 14C, an imaging device according to the seventh exemplary embodiment will be described.

FIG. 14A is a plan view schematically illustrating a 2×2 matrix of pixels of the imaging device. Referring to FIG. 14A, pixels including the p-type semiconductor region 915 and the n-type semiconductor region 305 and pixels including the p-type semiconductor region 1315 and the n-type semiconductor region 1305 are alternately arranged.

FIG. 14B is a cross-sectional view taken along line XIVB-XIVB illustrated in FIG. 14A. FIG. 14C is a cross-sectional view taken along line XIVC-XIVC illustrated in FIG. 14A.

A description regarding elements similar to those illustrated and described in FIGS. 1 to 13B is omitted.

In the seventh exemplary embodiment, the p-type semiconductor regions 915 and 1315 correspond to the third semiconductor region 112, and the n-type semiconductor regions 305 and 1305 correspond to the fourth semiconductor region 113.

The seventh exemplary embodiment differs from the first to sixth exemplary embodiments described above in that the capacitance to be connected is changed on a pixel-by-pixel basis. In the seventh exemplary embodiment, FIG. 14B illustrates the cross-sectional view of the FIG. 9B, and FIG. 14C illustrates the cross-sectional view of FIG. 13B; however, the cross-sectional views used in the seventh exemplary embodiment are not limited to these ones.

The seventh exemplary embodiment adopts a configuration in which the magnitude of the capacitance that changes the capacitance value of the input node of the amplifying transistor 205 is changed by switching the connection state on a pixel-by-pixel basis, thereby allowing the dynamic range of each pixel to be decided upon independently.

FIGS. 14A to 14C illustrate an imaging device equipped with color filters of the Bayer pattern. FIG. 14B illustrates a pixel equipped with a green color filter 321A which has a higher contribution to a luminance signal than the other colors. The pixel adopts the configuration including the p-type semiconductor region 915, the n-type semiconductor region 305, and the n-type semiconductor region 316.

In contrast, a pixel equipped with a red or blue color filter 321B which has a lower contribution to a luminance signal than the green one adopts the configuration including the p-type semiconductor region 1315 and the n-type semiconductor region 1305 as illustrated in FIG. 14C.

In this way, the pixel equipped with the green color filter 321A and the pixel equipped with the red or blue color filter 321B can have different capacitances obtained when the capacitance 208 is connected. In this case, the pixel equipped with the green color filter 321A has a larger capacitance connected by the switching transistor 207.

Accordingly, the pixel equipped with the green color filter 321A can make the total capacitance value of the n-type semiconductor region 305 and the capacitance 208 larger than the pixel equipped with the red or blue color filter 321B. As a result, the dynamic range of the pixel equipped with the green color filter 321A is increased, and the dynamic range of the entire image can be increased accordingly.

Examples of the method for making the capacitance value variable include a method for changing the capacitance value by changing the area of the gate 304 or the size of the second region 313B and thereby changing the area of the n-type semiconductor region 1305 and the area of the semiconductor region that forms the capacitance 208.

However, the method for making the capacitance value of each pixel variable by changing arrangement and concentrations of impurities used in ion implantation when forming elements while keeping the structure of the pixels on the semiconductor substrate identical as in the seventh exemplary embodiment can make the influence of unevenness in the sensitivity or the like smaller, and an improved image quality is expected.

The structure on the semiconductor substrate can also be changed taking the unevenness into account.

Note that the present invention is not limited to the embodiment and the exemplary embodiments described above, and various changes and modifications can be made without departing from the object and scope of the present invention. In the seventh exemplary embodiment, pixels having different dynamic ranges need not be arranged alternately.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-151122, filed Jul. 24, 2014, which is hereby incorporated by reference herein in its entirety.

What is claimed is:

1. An imaging device comprising:
   a plurality of pixels each including
      a photoelectric converter including a p-n junction formed of a first semiconductor region and a second semiconductor region and for accumulating signal carriers in the second semiconductor region,
      an amplifying transistor configured to amplify a signal based on the signal carriers, and
      a capacitance including a p-n junction formed of a third semiconductor region and a fourth semiconductor region, the third semiconductor region having a conductivity type identical to a conductivity type of the first semiconductor region, the fourth semiconductor region having a conductivity type opposite to the conductivity type of the third semiconductor region,
   wherein each of the plurality of pixels changes a capacitance value of an input node of the amplifying transistor by switching a connection state of the capacitance,
   wherein a doping impurity concentration of an impurity of a conductivity type identical to the conductivity type of the third semiconductor region at an interface of the p-n junction of the capacitance is higher than a doping impurity concentration of an impurity of a conductivity type identical to the conductivity type of the first semiconductor region at an interface of the p-n junction of the photoelectric converter,
   wherein the amplifying transistor has a gate disposed on a principal surface of a semiconductor substrate,
   wherein the first semiconductor region is disposed at a position deeper than a position of the second semiconductor region with respect to the principal surface, and
   wherein the third semiconductor region is disposed at a position deeper than a position of the fourth semiconductor region with respect to the principal surface.

2. The imaging device according to claim 1, wherein the first semiconductor region has a plurality of doping impurity concentration peaks at different depths with respect to the principal surface, and
   wherein an impurity concentration of the third semiconductor region is higher than a doping impurity concentration peak at a depth closest to the interface of the p-n junction formed of the first semiconductor region and the second semiconductor region among the plurality of doping impurity concentration peaks.

3. The imaging device according to claim 1, wherein a part of the fourth semiconductor region forms the p-n junction with the third semiconductor region, and another part of the fourth semiconductor region forms a p-n junction with a semiconductor region having a lower impurity concentration than the third semiconductor region.

4. The imaging device according to claim 1, wherein the capacitance further includes a metal oxide semiconductor capacitor.

5. The imaging device according to claim 1, wherein the capacitance further includes a gate, and the connection state of the capacitance is switched in accordance with a voltage applied to the gate.

6. The imaging device according to claim 5, wherein the photoelectric converter and the capacitance are disposed in different active regions, and
   wherein the input node of the amplifying transistor includes
      a fifth semiconductor region disposed in the same active region as the capacitance,
      a sixth semiconductor region disposed in the same active region as the photoelectric converter, and
      a conductor that electrically connects the fifth semiconductor region and the sixth semiconductor region to each other.

7. The imaging device according to claim 6, wherein the sixth semiconductor region forms a p-n junction with a semiconductor region having a lower impurity concentration than the third semiconductor region.

8. The imaging device according to claim 6, wherein the fourth semiconductor region and the fifth semiconductor region are disposed on respective sides of the gate of the capacitance.

9. The imaging device according to claim 6, wherein at least a part of the fifth semiconductor region forms a p-n junction with a semiconductor region having a lower impurity concentration than the third semiconductor region.

10. The imaging device according to claim 6, wherein a seventh semiconductor region having a conductivity type opposite to the conductivity type of the third semiconductor region is disposed at a position at which the seventh semiconductor region and the gate overlap with each other in plan view, and
wherein the seventh semiconductor region has a lower impurity concentration than the fifth semiconductor region.

11. The imaging device according to claim 10, wherein the seventh semiconductor region forms an interface with a gate insulating film of the capacitance.

12. The imaging device according to claim 10, wherein the seventh semiconductor region, a semiconductor region having a lower impurity concentration than the third semiconductor region, and the third semiconductor region are disposed in an order of the seventh semiconductor region, the semiconductor region having a lower impurity concentration than the third semiconductor region, and the third semiconductor region in a depth direction so as to overlap with one another in plan view.

13. The imaging device according to claim 10, wherein the seventh semiconductor region forms a p-n junction with a semiconductor region having a lower impurity concentration than the third semiconductor region.

14. The imaging device according to claim 5, wherein each of the plurality of pixels further includes a reset transistor configured to reset a potential of the input node of the amplifying transistor, and
wherein a voltage applied to the gate of the capacitance when the capacitance is set in a connected state is lower than a threshold of the reset transistor.

15. The imaging device according to claim 1, wherein the second semiconductor region extends to a position deeper than a position to which the fourth semiconductor region extends.

16. The image device according to claim 1, wherein each of the plurality of pixels further includes a selection transistor configured to control electrical conduction between the amplifying transistor and a signal line, and
wherein at least a part of an eighth semiconductor region that forms an output node of the selection transistor forms a p-n junction with a semiconductor region having a lower impurity concentration than the third semiconductor region.

17. The imaging device according to claim 1, wherein at least a part of a ninth semiconductor region that forms an output node of the amplifying transistor forms a p-n junction with a semiconductor region having a lower impurity concentration than the third semiconductor region.

18. The imaging device according to claim 1, wherein each of the plurality of pixels is equipped with a corresponding one of color filters of different colors,
wherein the color filters include a first filter of green and a second filter of red or blue, and
wherein the pixel equipped with the first filter has a larger capacitance value of the input node of the amplifying transistor than the pixel equipped with the second filter when the capacitance is set in a connected state.

19. An imaging device comprising:
a plurality of pixels each including
a photoelectric converter including a p-n junction formed of a first semiconductor region and a second semiconductor region and for accumulating signal carriers in the second semiconductor region,
an amplifying transistor configured to amplify a signal based on the signal carriers, and
a capacitance including a p-n junction formed of a third semiconductor region and a fourth semiconductor region, the third semiconductor region having a conductivity type identical to a conductivity type of the first semiconductor region, the fourth semiconductor region having a conductivity type opposite to the conductivity type of the third semiconductor region,
wherein each of the plurality of pixels changes a capacitance value of an input node of the amplifying transistor by switching a connection state of the capacitance,
wherein an impurity concentration of the third semiconductor region is higher than an impurity concentration of the first semiconductor region,
wherein the amplifying transistor has a gate disposed on a principal surface of a semiconductor substrate,
wherein the first semiconductor region is disposed at a position deeper than a position of the second semiconductor region with respect to the principal surface, and
wherein the third semiconductor region is disposed at a position deeper than a position of the fourth semiconductor region with respect to the principal surface.

* * * * *